(12) United States Patent
Khan et al.

(10) Patent No.: US 9,059,031 B2
(45) Date of Patent: Jun. 16, 2015

(54) DRAM WITH DUAL LEVEL WORD LINES

(71) Applicant: International Business Machines Corporation, Armonk, NY (US)

(72) Inventors: Babar A. Khan, Ossining, NY (US); Effendi Leobandung, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 53 days.

(21) Appl. No.: 14/077,351

(22) Filed: Nov. 12, 2013

(65) Prior Publication Data
US 2014/0065777 A1    Mar. 6, 2014

Related U.S. Application Data

(62) Division of application No. 13/551,766, filed on Jul. 18, 2012, now Pat. No. 8,779,490.

(51) Int. Cl.
*H01L 21/8242* (2006.01)
*H01L 27/108* (2006.01)
*H01L 21/336* (2006.01)
*H01L 29/76* (2006.01)
(Continued)

(52) U.S. Cl.
CPC .......... *H01L 27/10867* (2013.01); *H01L 21/84* (2013.01); *H01L 27/0207* (2013.01); *H01L 27/10891* (2013.01); *H01L 29/945* (2013.01); *H01L 27/1203* (2013.01)

(58) Field of Classification Search
CPC .................. H01L 27/10876; H01L 27/10867; H01L 27/10823; H01L 29/66181; H01L 29/66621; H01L 21/84; H01L 29/4236
USPC .......... 438/243, 270, 386, 238, 268; 257/296, 257/301, 303
See application file for complete search history.

(56) References Cited

U.S. PATENT DOCUMENTS 6,664,582 B2    12/2003    Fried et al.
6,987,295 B2    1/2006    Sell et al.
(Continued)

OTHER PUBLICATIONS

Mueller, W. et al., "Challenges for the DRAM Cell Scaling to 40nm" IEEE International Electron Devices Meeting, 2005 IEDM, Technical Digest (Dec. 5, 2005) 4 pages.
(Continued)

*Primary Examiner* — Ha Tran T Nguyen
*Assistant Examiner* — Thai T Vuong
(74) *Attorney, Agent, or Firm* — Scully, Scott, Murphy & Presser, P.C.; Joseph P. Abate, Esq.

(57) ABSTRACT

A top semiconductor layer and conductive cap structures over deep trench capacitors are simultaneously patterned by an etch. Each patterned portion of the conductive cap structures constitutes a conductive cap structure, which laterally contacts a semiconductor material portion that is one of patterned remaining portions of the top semiconductor layer. Gate electrodes are formed as discrete structures that are not interconnected. After formation and planarization of a contact-level dielectric layer, passing gate lines are formed above the contact-level dielectric layer in a line level to provide electrical connections to the gate electrodes. Gate electrodes and passing gate lines that are electrically connected among one another constitute a gate line that is present across two levels.

9 Claims, 27 Drawing Sheets

(51) Int. Cl.
*H01L 29/94* (2006.01)
*H01L 21/84* (2006.01)
*H01L 27/02* (2006.01)
*H01L 27/12* (2006.01)

(56) References Cited

U.S. PATENT DOCUMENTS

| | | | |
|---|---|---|---|
| 7,145,220 B2 | 12/2006 | Morikado | |
| 7,312,492 B2 | 12/2007 | Schwerin | |
| 7,332,390 B2 | 2/2008 | Jang et al. | |
| 7,445,985 B2 | 11/2008 | Schwerin | |
| 7,781,283 B2 | 8/2010 | Anderson et al. | |
| 7,898,014 B2 | 3/2011 | Cheng et al. | |
| 2004/0036102 A1* | 2/2004 | Sell et al. | 257/301 |
| 2004/0209436 A1 | 10/2004 | Chen | |
| 2005/0184326 A1 | 8/2005 | Cheng | |
| 2005/0218446 A1 | 10/2005 | Hierlemann et al. | |
| 2006/0056228 A1 | 3/2006 | Schloesser et al. | |
| 2006/0263970 A1 | 11/2006 | Jang | |
| 2006/0292789 A1 | 12/2006 | Cheng et al. | |
| 2007/0057302 A1 | 3/2007 | Ho et al. | |
| 2007/0218625 A1* | 9/2007 | Ho et al. | 438/243 |
| 2007/0235792 A1 | 10/2007 | Kwon et al. | |
| 2007/0257294 A1 | 11/2007 | Cheng et al. | |
| 2008/0258268 A1* | 10/2008 | Cheng | 257/622 |
| 2008/0305605 A1* | 12/2008 | Cheng et al. | 438/389 |
| 2008/0318377 A1 | 12/2008 | Lee et al. | |
| 2009/0061583 A1* | 3/2009 | Wang | 438/268 |
| 2009/0159948 A1* | 6/2009 | Ho et al. | 257/301 |
| 2009/0242954 A1* | 10/2009 | Chou | 257/301 |
| 2009/0256185 A1* | 10/2009 | Cheng et al. | 257/301 |
| 2009/0289291 A1* | 11/2009 | Cheng et al. | 257/301 |
| 2010/0102373 A1* | 4/2010 | Li et al. | 257/301 |
| 2010/0133608 A1* | 6/2010 | Ho et al. | 257/330 |
| 2010/0283093 A1 | 11/2010 | Pei et al. | |
| 2011/0163365 A1 | 7/2011 | Cannon et al. | |
| 2011/0248326 A1 | 10/2011 | Kanakasabapathy et al. | |
| 2011/0272762 A1* | 11/2011 | Booth et al. | 257/347 |
| 2012/0068237 A1 | 3/2012 | Booth et al. | |

OTHER PUBLICATIONS

Notice of Allowance dated Mar. 4, 2014 received in a related U.S. Appl. No. 13/551,766.

* cited by examiner

DRAM WITH DUAL LEVEL WORD LINES

CROSS REFERENCE TO RELATED APPLICATION

This application is a divisional of U.S. patent application Ser. No. 13/551,766, filed on Jul. 18, 2012, the entire content and disclosure of which is incorporated herein by reference.

BACKGROUND

The present disclosure relates to a semiconductor structure, and particularly to a dynamic random access memory (DRAM) cell including word lines located in two levels and a method of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

A strap structure is employed to provide an electrically conductive path between an inner electrode of a deep trench capacitor and the source of an access transistor. As dimensions of semiconductor devices scale, dimensions available for forming deep trench capacitors and strap structures continue to shrink.

SUMMARY

A top semiconductor layer and conductive cap structures over deep trench capacitors are simultaneously patterned by an etch. Each patterned portion of the conductive cap structures constitutes a conductive cap structure, which laterally contacts a semiconductor material portion that is one of patterned remaining portions of the top semiconductor layer. Gate electrodes are formed as discrete structures that are not interconnected. After formation and planarization of a contact-level dielectric layer, passing gate lines are formed above the contact-level dielectric layer in a line level to provide electrical connections to the gate electrodes. Gate electrodes and passing gate lines that are electrically connected among one another constitute a gate line that is present across two levels.

According to an aspect of the present disclosure, a semiconductor structure is provided, which includes a trench capacitor embedded in a substrate and including an inner electrode, a node dielectric, and an outer electrode. Further, the semiconductor structure includes a conductive strap structure in contact with, and overlying, the inner electrode. Yet further, the semiconductor structure includes an access transistor, which includes a source region and a drain region that are located in a semiconductor material portion in the substrate, and a gate electrode overlying a body region of the semiconductor material portion. The source region is in contact with the conductive strap structure. Still further, the semiconductor structure includes a passing gate line overlying a portion of the conductive strap structure and contacting another gate electrode of another access transistor.

According to another aspect of the present disclosure, a method of forming a semiconductor structure is provided. Trench capacitors are formed in a substrate. Each of the trench capacitors includes an inner electrode, a node dielectric, and an outer electrode. Laterally contacting pairs of a semiconductor material portion and a conductive strap structure are formed. Each of the conductive strap structures contacts an inner electrode of one of the trench capacitors. Gate stacks are formed. Each gate stack straddles over one of the semiconductor material portions and includes a gate dielectric and a gate electrode. Passing gate lines are formed over a plane of a topmost surface of the gate electrodes. Each of the passing gate lines contacts top surfaces of a pair of gate electrodes.

DETAILED DESCRIPTION

Figure 1A:
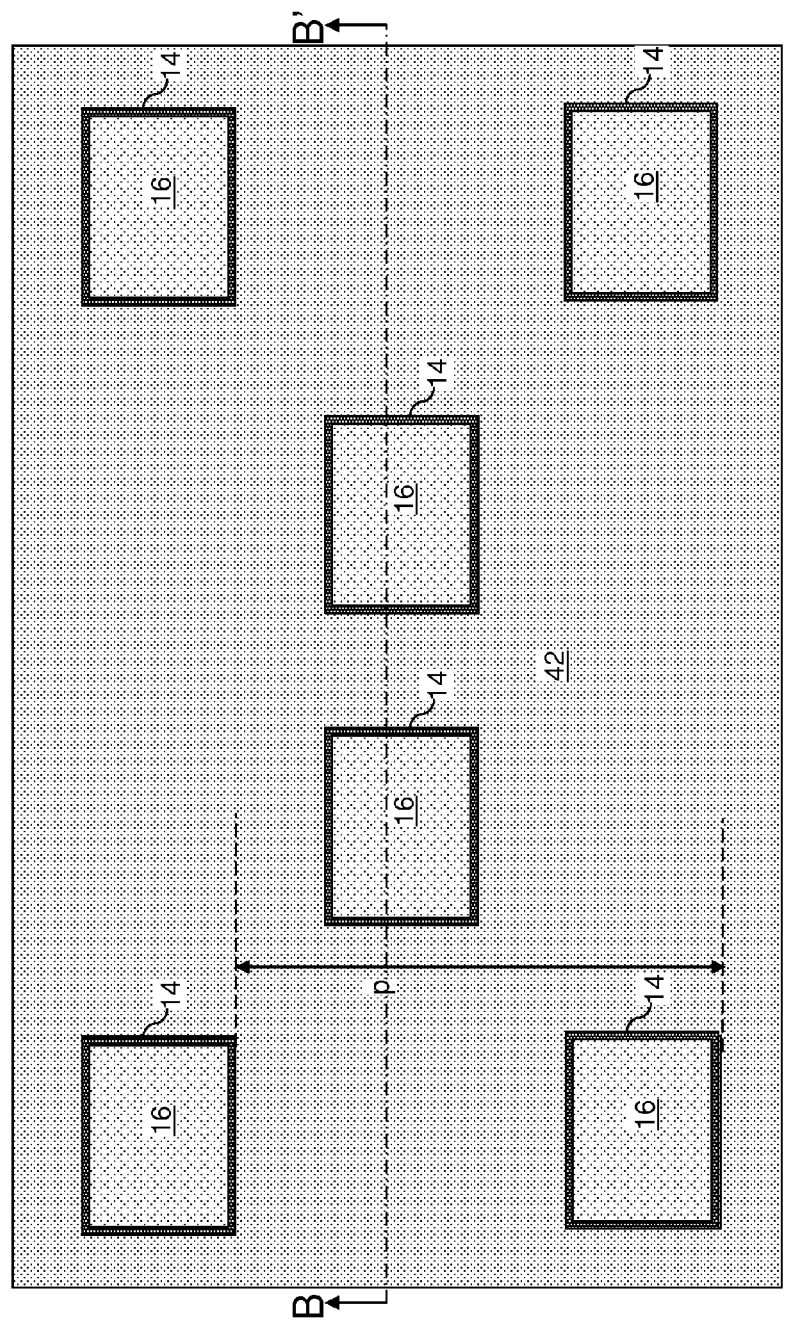
FIG. 1A is a top-down view of an exemplary semiconductor structure after formation of deep trench capacitors a semiconductor-on-insulator (SOI) substrate according to an embodiment of the present disclosure.

As stated above, the present disclosure relates to a dynamic random access memory (DRAM) cell including word lines located in two levels and a method of manufacturing the same. These aspects of the present disclosure are now described in detail with accompanying figures. It is noted that like reference numerals refer to like elements across different embodiments. The drawings are not necessarily drawn to scale.

Figure 1B:
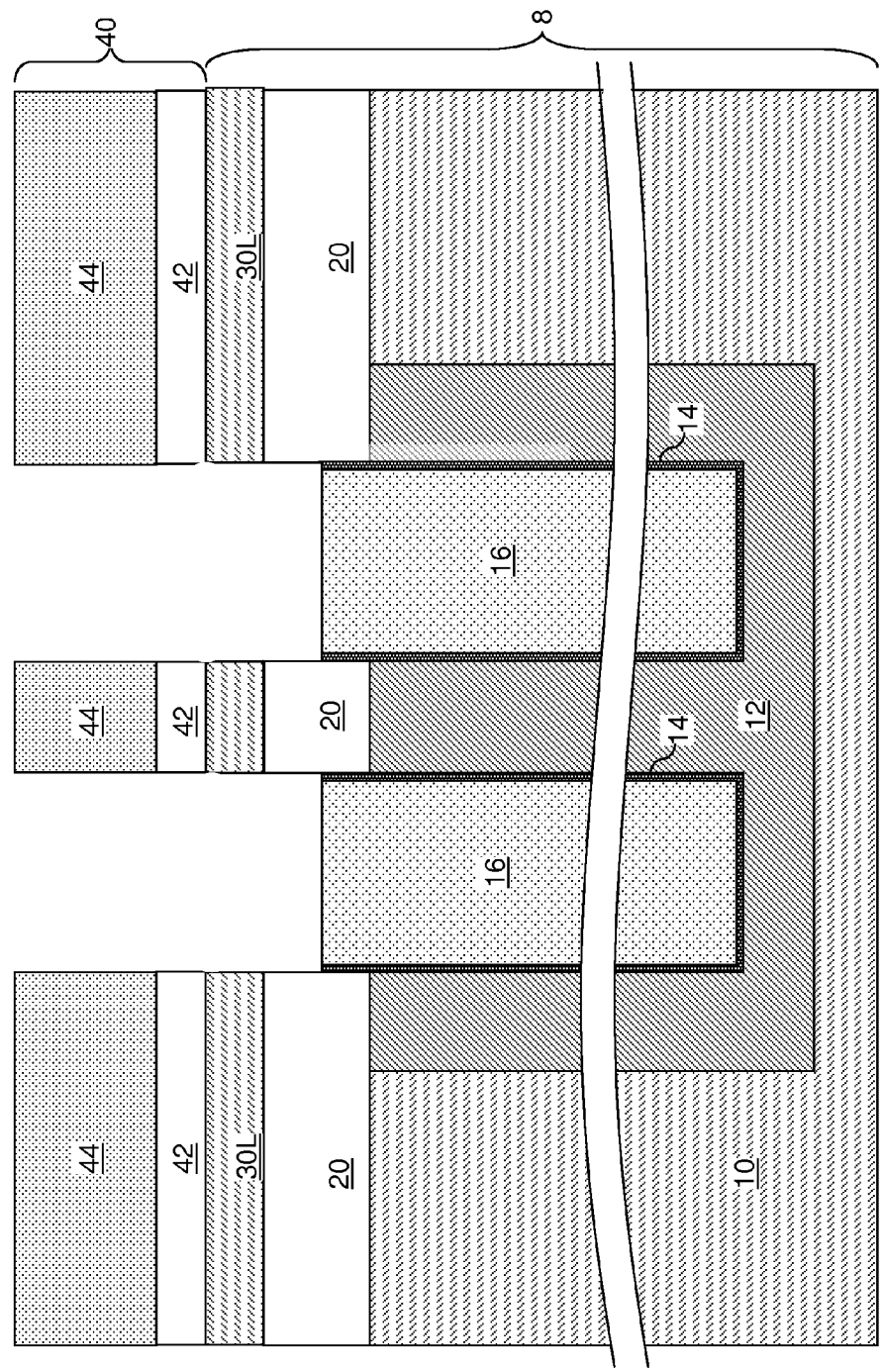
FIG. 1B is a vertical cross-sectional view of the exemplary semiconductor structure along the vertical plane B-B' of FIG. 1A.

Referring to FIGS. 1A and 1B, an exemplary semiconductor structure according to an embodiment of the present disclosure includes a substrate 8, which can be a semiconductor-on-insulator (SOI) substrate or a bulk substrate. If the substrate 8 is an SOI substrate, the SOI substrate includes a stack, from bottom to top, of a bottom semiconductor layer 10, a buried insulator layer 20, and a top semiconductor layer 30L, which can be initially provided as a planar layer having a same thickness throughout over the buried insulator layer.

The bottom semiconductor layer 10 includes a semiconductor material. The buried insulator layer 20 includes a dielectric material such as silicon oxide, silicon nitride, a dielectric metal oxide, or a combination thereof. The top semiconductor layer 30L includes a semiconductor material, which can be the same as, or different from, the semiconductor material of the bottom semiconductor layer 10.

Each of the bottom semiconductor layer 10 and the top semiconductor layer 30L includes a semiconductor material independently selected from elemental semiconductor materials (e.g., silicon, germanium, carbon, or alloys thereof), III-V semiconductor materials, or II-VI semiconductor materials. Each semiconductor material for the bottom semiconductor layer 10 and the top semiconductor layer 30L can be independently single crystalline, polycrystalline, or amorphous. In one embodiment, the bottom semiconductor layer 10 and the top semiconductor layer 30L are single crystalline. In one embodiment, the bottom semiconductor layer 10 and the top semiconductor layer 30L include single crystalline silicon.

In one embodiment, the bottom semiconductor layer 10 can be doped with dopants of a first conductivity type. The first conductivity type can be p-type or n-type.

In one embodiment, the thickness of the top semiconductor layer 30L can be from 5 nm to 300 nm, the thickness of the buried insulator layer 20 can be from 50 nm to 1,000 nm, and the thickness of the bottom semiconductor layer 10 can be from 50 microns to 2 mm, although lesser and greater thicknesses can also be employed for each of these layers.

Alternately, the substrate 8 can be a bulk semiconductor substrate, in which a semiconductor material layer 30L extends from the topmost surface to the bottommost surface of the substrate. In one embodiment, the substrate 8 can be a single crystalline silicon substrate.

At least one pad layer 40 can be deposited on the substrate 8, for example, by chemical vapor deposition (CVD) or atomic layer deposition (ALD). The at least one pad layer 40 can include one or more layers that can be employed as an etch mask for forming a deep trench in the substrate 8. As used herein, a "deep trench" refers to a trench that extends from a topmost surface of a semiconductor-on-insulator (SOI) substrate through a top semiconductor layer and a buried insulator layer and partly into an underlying semiconductor layer, i.e., the bottom semiconductor layer 10.

In one embodiment, each of the at least one pad layer 40 can include a dielectric material such as silicon nitride, a dielectric metal nitride, a doped silicon undoped silicon oxide, or a dielectric metal oxide. The total thickness of the at least one pad layer 40 can be from 100 nm to 2,000 nm, although lesser and greater thicknesses can also be employed.

In one embodiment, the at least one pad layer 40 can include a stack of a lower pad layer 42 and an upper pad layer 44. The lower pad layer 42 can include a first dielectric material, and the upper pad layer 44 can include a second dielectric material that is different from the first dielectric material. In one embodiment, the lower pad layer 42 can include silicon oxide, and the upper pad layer 44 can include silicon nitride. In one embodiment, the thickness of the lower pad layer 42 can be from 10 nm to 100 nm, and the thickness of the upper pad layer 44 can be from 40 nm to 360 nm, although lesser and greater thicknesses can also be employed for each of the lower pad layer 42 and the upper pad layer 44.

A photoresist layer (not shown) can be applied over the at least one pad layer 40, and can be lithographically patterned to form openings each having an area of a deep trench to be subsequently formed. In one embodiment, the pattern for the openings can have a periodicity along at least one horizontal direction. In one embodiment, the pattern for the openings can be periodic in two orthogonal horizontal directions.

The pattern in the photoresist layer can be transferred into the at least one pad layer 40. Subsequently, the pattern in the at least one pad layer 40 can be transferred through the top semiconductor layer 30L, the buried insulator layer 20, and an upper portion of the bottom semiconductor layer 10 by an anisotropic etch that employs the at least one pad layer 40 as an etch mask. Deep trenches can be formed for each opening in the at least one pad layer 40. The photoresist can be removed by ashing, or can be consumed during the etch process that forms the deep trench. In one embodiment, the deep trenches can be arranged as a periodic one dimensional array or a periodic two dimensional array. In one embodiment, the deep trenches can have a pitch p along a horizontal direction as illustrated in FIG. 1A.

The sidewalls of the deep trench can be substantially vertically coincident among the various layers through which the deep trench extends. As used herein, sidewalls of multiple elements are "vertically coincident" if the sidewalls of the multiple elements overlap in a top-down view such as FIG. 1A. As used herein, sidewalls of multiple elements are "substantially vertically coincident" if the lateral offset of the sidewalls of the multiple elements from a perfectly vertical surface is within 5 nm. The depth of the deep trenches as measured from the plane of the topmost surface of the substrate 8 to the bottom surface of the deep trenches can be from 500 nm to 10 microns, although lesser and greater depths can also be employed. The lateral dimensions of each deep trench can be limited by the lithographic capabilities, i.e., the ability of a lithographic tool to print the image of an opening on the photoresist layer. In one embodiment, the "width," i.e., a sidewall to sidewall distance, of the deep trench along the direction parallel to the B-B' plane and along the direction perpendicular to the B-B' plane can be from 32 nm to 150 nm, although lesser dimensions can be employed with availability of lithographic tools capable of printing smaller dimensions in the future.

A buried plate 12 can be formed by doping a portion of the bottom semiconductor layer 12 in proximity of sidewalls of the bottom semiconductor layer 10 within each deep trench. Dopants can be introduced, for example, by outdiffusion from a dopant-including disposable material (such as a doped silicate glass) or by ion implantation as known in the art. Further, any other method of forming a buried plate 12 in the bottom semiconductor layer 10 of the substrate 8 can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the bottom semiconductor layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A dielectric material for node dielectrics 14 of deep trench capacitors can be deposited conformally on all physically exposed sidewalls in the deep trenches and on the top surface of the upper pad layer. The dielectric material for the node dielectrics 14 can include any dielectric material that can be employed as a node dielectric material in a capacitor known in the art. For example, the dielectric material for the node dielectrics 14 can include at least one of silicon nitride and a dielectric metal oxide material such as high dielectric constant (high-k) gate dielectric material as known in the art.

A conductive material for inner electrodes 16 of deep trench capacitors can be deposited to completely fill the deep trenches. The conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The inner electrode 16 can be deposited by physical vapor deposition (PVD), chemical vapor deposition (CVD), electroplating, electroless plating, or a combination thereof. The material for the inner electrode 16 is deposited to a thickness that is sufficient to completely fill the deep trenches.

The material for the inner electrode 16 can be vertically recessed to a level between the top surface of the buried insulator layer 20 and the bottom surface of the buried insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectric 14.

Upon recess, the topmost surface of each inner electrode 16 can be substantially planar, and can be located between the level of the top surface of the buried insulator layer 20 and the level of the bottom surface of the buried insulator layer 20. A surface is substantially planar if the planarity of the surface is limited by microscopic variations in surface height that accompanies semiconductor processing steps known in the art. A cavity is present above the inner electrode 16 at this time.

The physically exposed portions of the node dielectric 14 can be removed by an etch, which can be a wet etch. For example, if the node dielectric 14 includes silicon nitride, the physically exposed portions of the node dielectric 14 can be removed by a wet etch employing hot phosphoric acid. Each set of a portion of a buried plate 12, a node dielectric 14, and an inner electrode 16 constitutes a trench capacitor (12, 14, 16). The buried plate 12 is an outer node of the trench capacitor, the node dielectric 14 is the dielectric separating the outer electrode from the inner electrode, and the inner electrode 16 is the inner electrode of the trench capacitor. The trench capacitor is embedded within the substrate 8. The buried insulator layer 20 overlies the buried plate 12 (i.e., the outer electrode). While the present disclosure is described for an embodiment in which deep trench capacitors are formed within an SOI substrate, embodiments in which the trenches are formed in a bulk semiconductor substrate are also contemplated herein.

Figure 2A:
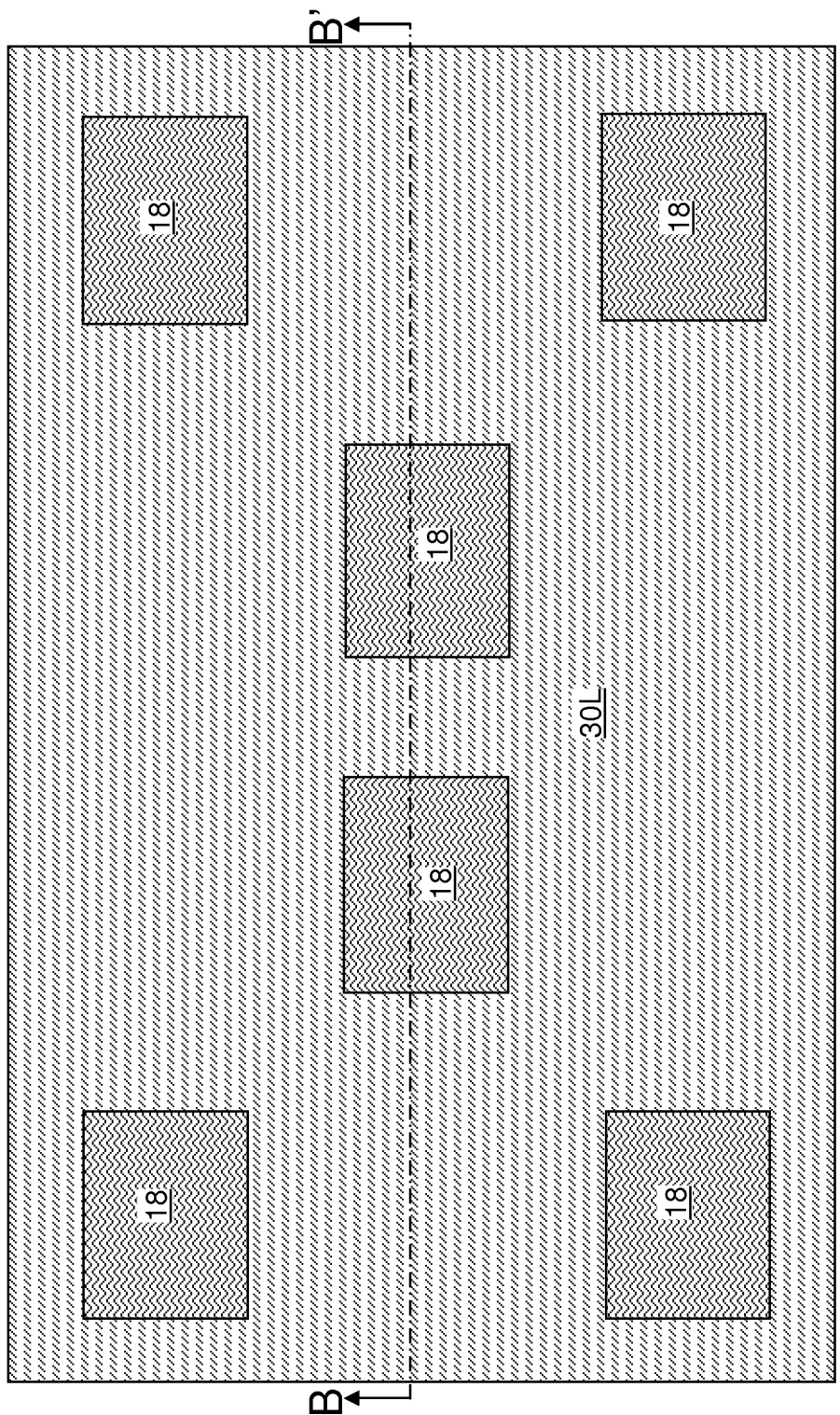
FIG. 2A is a top-down view of an exemplary semiconductor structure after formation of conductive cap structures according to an embodiment of the present disclosure.
Figure 2B:
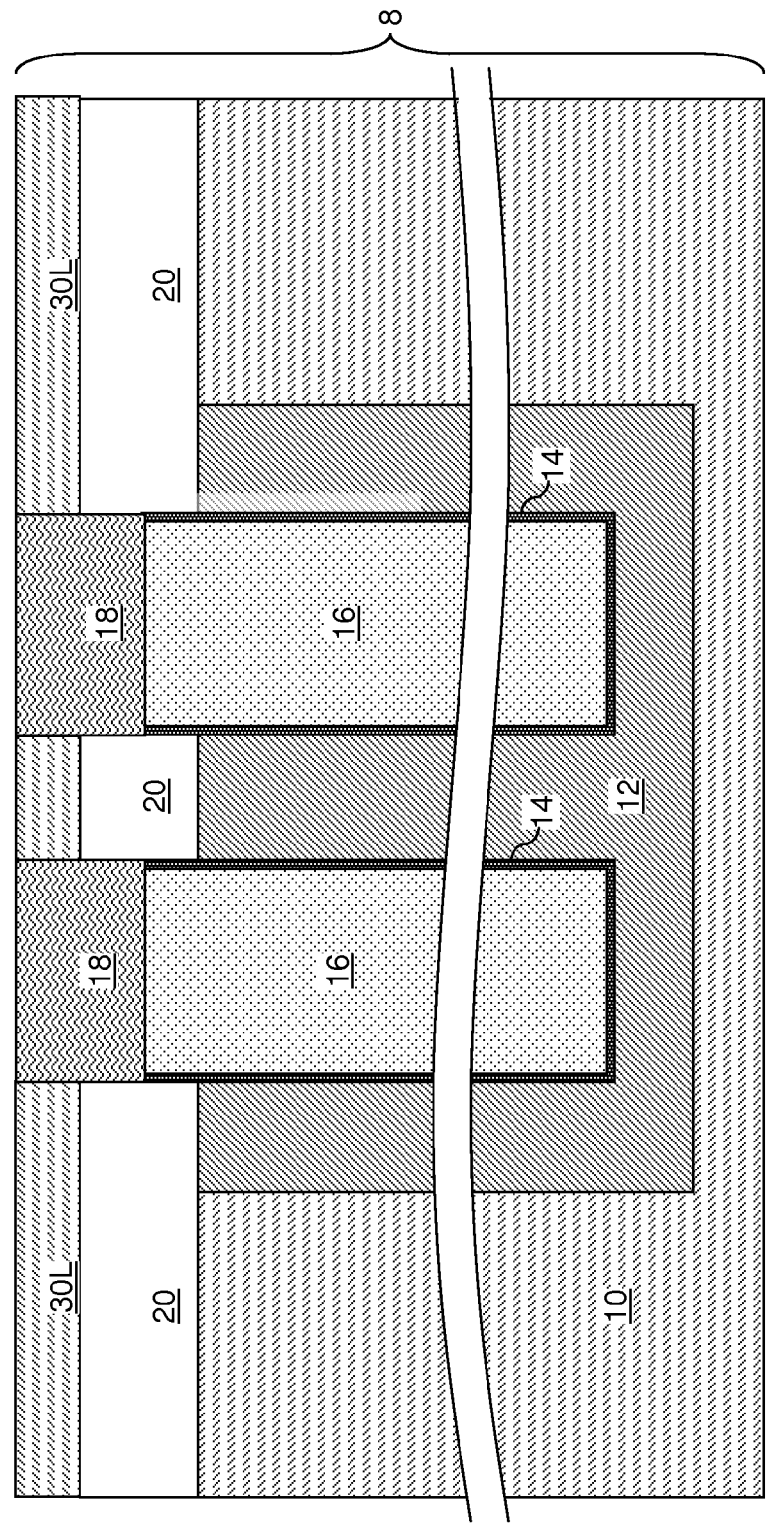
FIG. 2B is a vertical cross-sectional view of the exemplary semiconductor structure along the vertical plane B-B' of FIG. 2A.

Referring to FIGS. 2A and 2B, a conductive strap structure 18 can be formed within each deep trench, for example, by depositing a conductive material within the cavity above each inner electrode 16 and above the at least one pad layer 40, and subsequently recessing the conductive material from above the at least one pad layer 40 and optionally recessing the conductive material at an upper portion of each deep trench. Specifically, the conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to completely fill the cavity.

The conductive material can be planarized, for example, by chemical mechanical planarization (CMP) employing the upper pad layer as a stopping layer. Subsequently, the conductive material is recessed below the topmost surface of the top semiconductor layer 30L to form the conductive strap structures 18. In one embodiment, the top surface of the conductive strap structures 18 can be located at or above the top surface of the top semiconductor layer 30L. The conductive strap structures 18 can include the same material as, or a material different from, the inner electrode 16. A cavity is formed above each conductive strap structures 18. Each conductive strap structure 18 is in contact with, and overlies, an inner electrode 16. A bottom surface of each conductive strap structure 18 is in contact with an inner electrode 16 at a horizontal plane located between a horizontal plane including a top surface of the buried insulator layer 20 and a horizontal plane including a bottom surface of the buried insulator layer 20.

The upper pad layer 44 can be removed, for example, by a wet etch selective to the lower pad layer. The lower pad layer 42 can be subsequently removed, for example, by another wet etch.

Figure 3A:
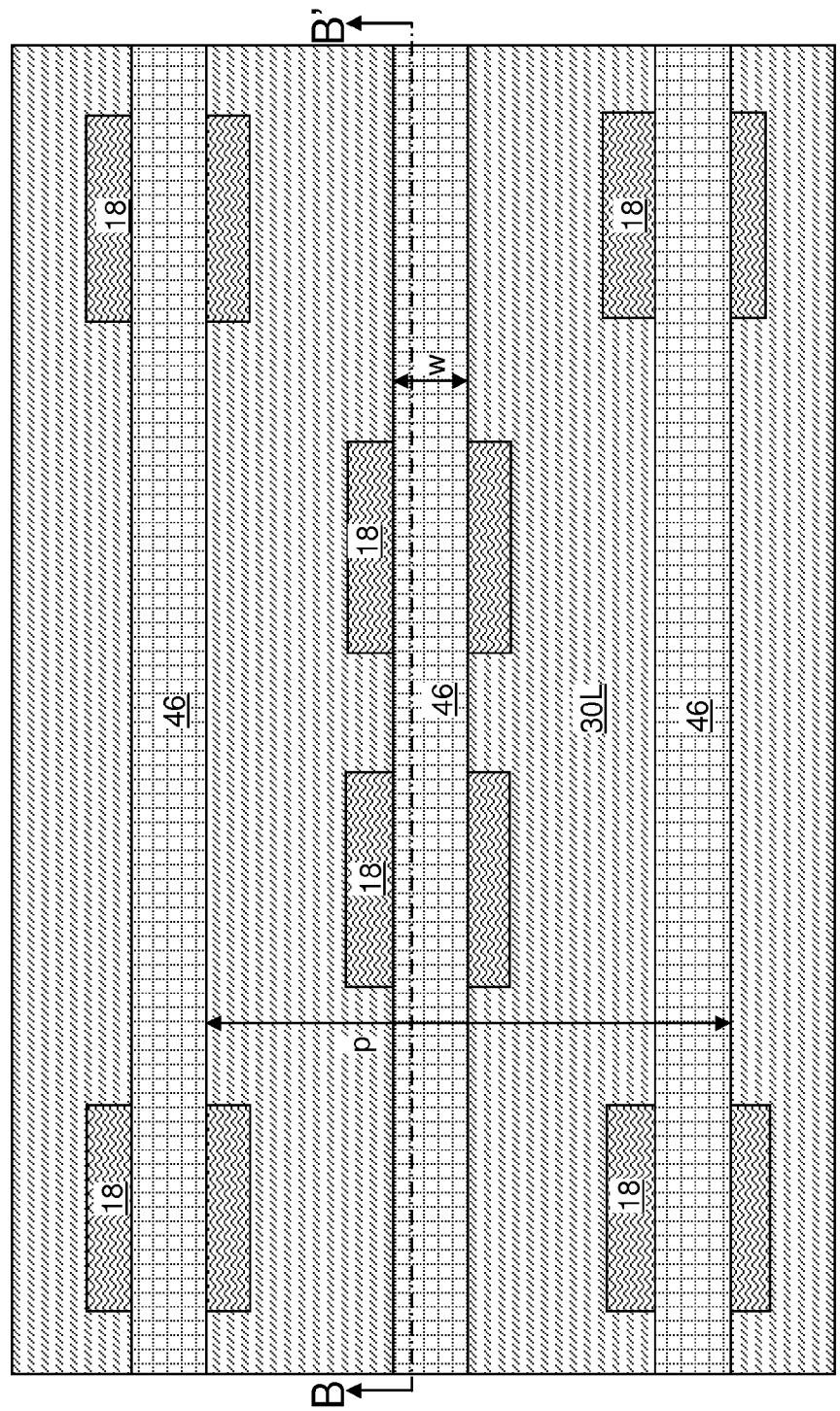
FIG. 3A is a top-down view of an exemplary semiconductor structure after formation of hardmask structures according to an embodiment of the present disclosure.
Figure 3B:
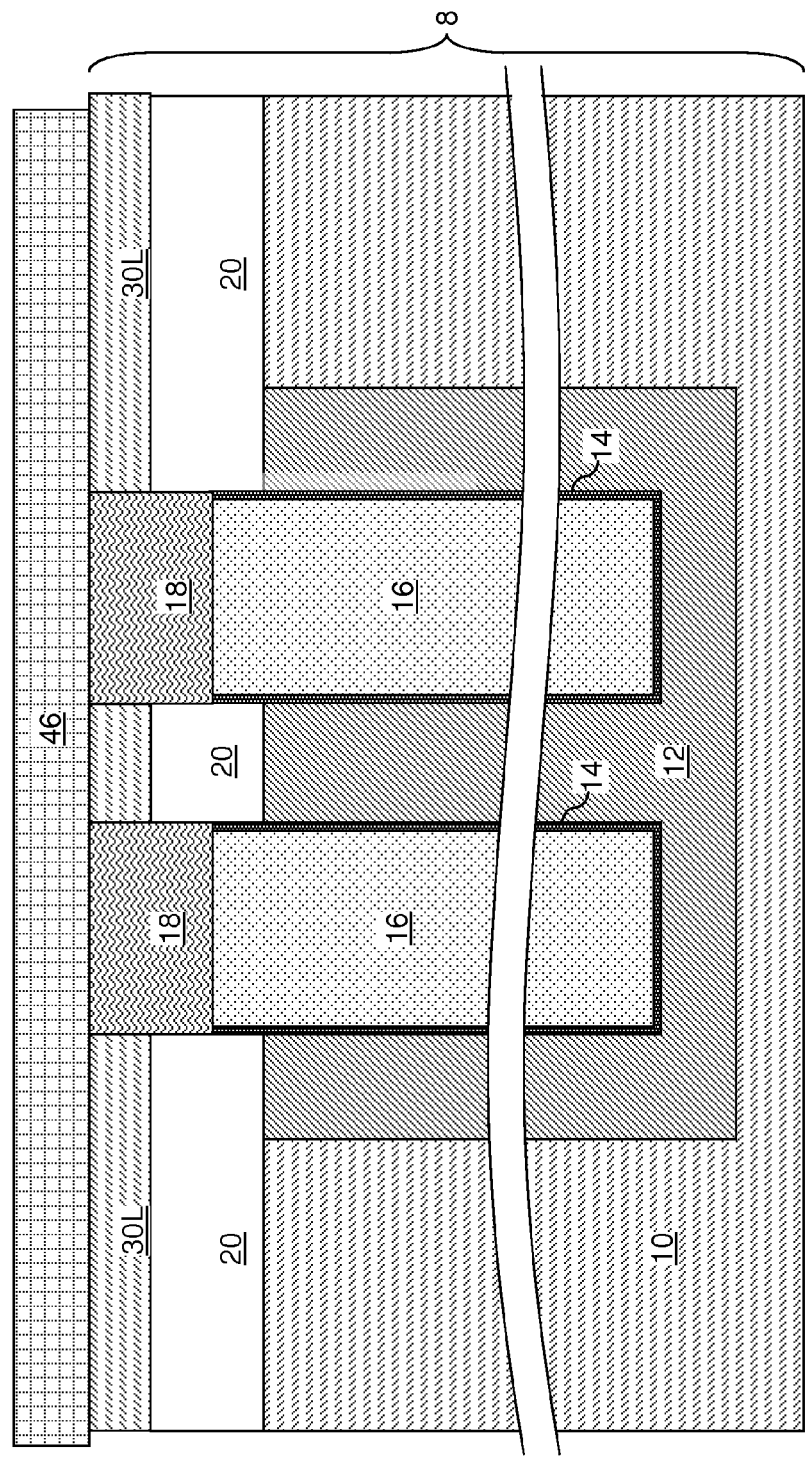
FIG. 3B is a vertical cross-sectional view of the exemplary semiconductor structure along the vertical plane B-B' of FIG. 3A.

Referring to FIGS. 3A and 3B, a hardmask layer is deposited over the top semiconductor layer 30L and the conductive cap structures 18, and is subsequently lithographically patterned to form hardmask structures 46. The hardmask layer (and correspondingly, the hardmask structures 46) can include a dielectric material such as silicon oxide, silicon nitride, silicon oxynitride, a dielectric metal oxide, a dielectric metal nitride, a dielectric metal oxynitride, or a combination thereof. The dielectric material of the hardmask layer can be deposited, for example, by chemical vapor deposition (CVD), atomic layer deposition (ALD), or other methods for depositing a dielectric material as known in the art. The thickness of the hardmask layer can be, for example, from 20 nm to 200 nm, although lesser and greater thicknesses can also be employed. In one embodiment, the hard mask layer includes silicon nitride.

The hardmask layer can be patterned by applying a photoresist layer (not shown), by lithographically patterning the photoresist layer by exposure and development, and by transferring the pattern in the patterned photoresist layer into the hardmask layer. The remaining portions of the hardmask layer constitute the hardmask structures 46. The patterned photoresist layer can be removed, for example, by ashing.

The hardmask structures 46 can extend along one direction (which is herein referred to as a lengthwise direction of the hardmask structures 46). In one embodiment, each of the hardmask structures 46 can have a same width w throughout. In one embodiment, the hardmask structures 46 can be a one-dimensional periodic array having a periodicity that is one half of the pitch p of the deep trenches along a horizontal direction that is perpendicular to the lengthwise direction of the hardmask structures 46.

Figure 4A:
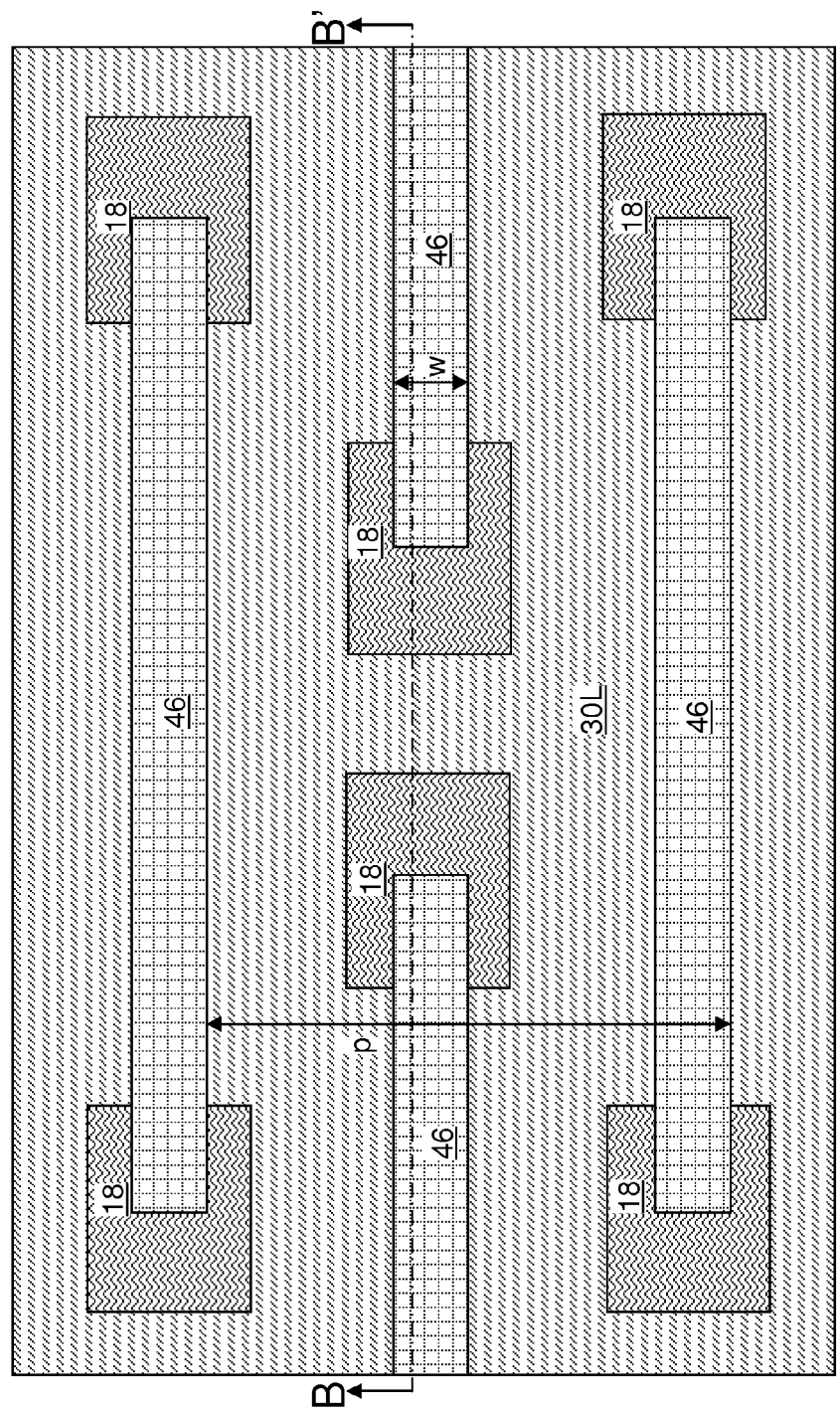
FIG. 4A is a top-down view of an exemplary semiconductor structure after patterning of the hardmask structures according to an embodiment of the present disclosure.
Figure 4B:
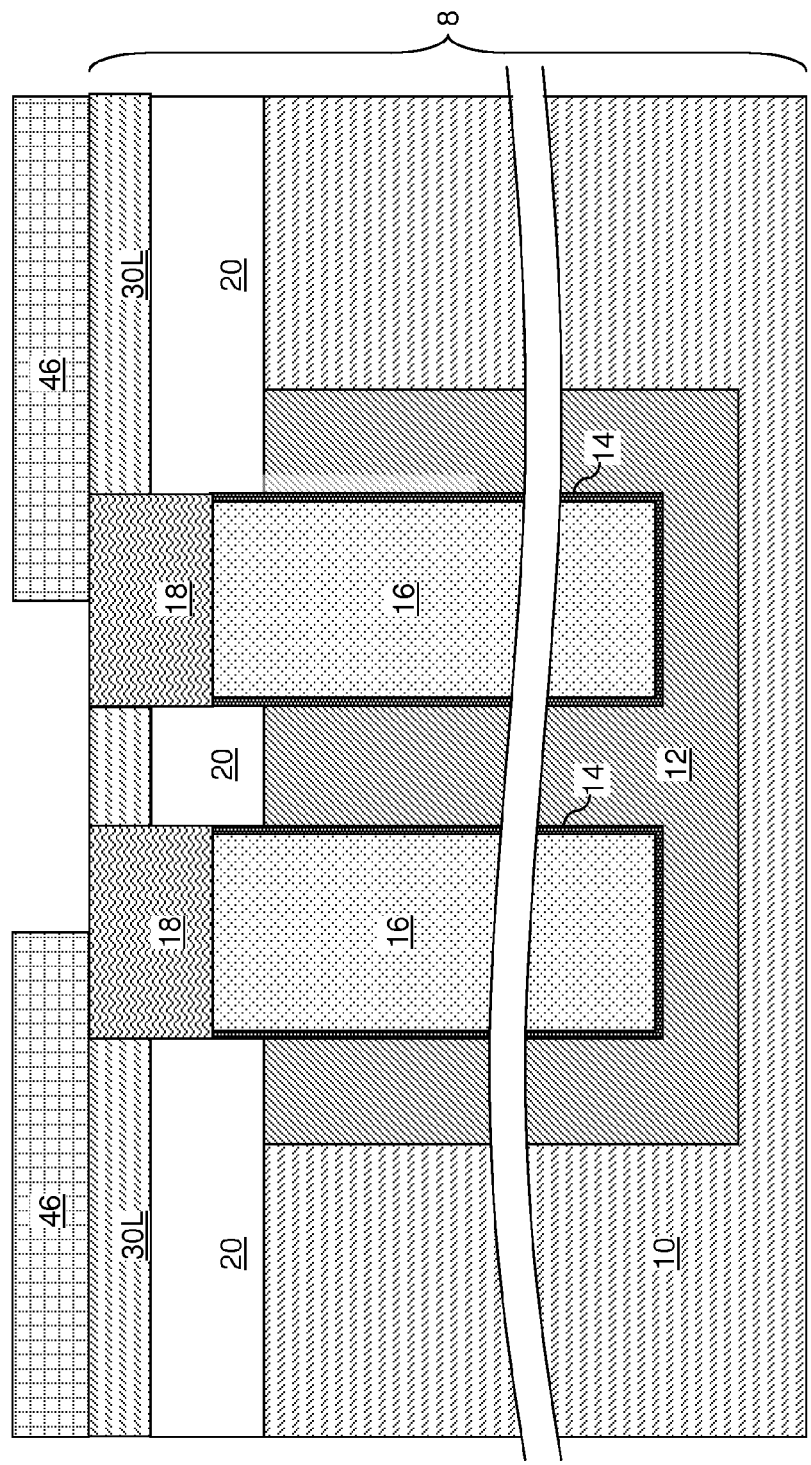
FIG. 4B is a vertical cross-sectional view of the exemplary semiconductor structure along the vertical plane B-B' of FIG. 4A.

Referring to FIGS. 4A and 4B, the hardmask structures 46 can further be patterned, for example, by applying another photoresist layer, lithographically patterning the photoresist layer, and removing physically exposed portions of the hardmask structures 46. The pattern in the photoresist layer is selected such that each end wall of the patterned hardmask structures 46 overlies one of the conductive cap structures 18. The end walls of the hardmask structures 46 can be substantially vertical, and can be perpendicular to the lengthwise direction of the hardmask structures 46, e.g., perpendicular to the horizontal direction within the plane B-B'.

In one embodiment, the hardmask structures 46 can form a two-dimensional periodic array, in which a unit pattern is periodically repeated along two orthogonal directions. In one embodiment, the hardmask structures 46 can have the same pitch p along the horizontal direction that is perpendicular to the lengthwise direction of the hardmask structures 46 as the deep trenches.

In one embodiment, each hardmask structure 46 has a pair of parallel vertical sidewalls that are separated by the width w and laterally extending along the lengthwise direction of the hardmask structures 46, and a pair of vertical end walls that are separated by a greater distance than the width w and perpendicular to the lengthwise direction of the hardmask structures 46. End portions of the parallel vertical sidewalls and the vertical end walls overlie the conductive cap structures 18. The width w can be any lithographic dimension. In one embodiment, the width w can be from 32 nm to 200 nm, although lesser and greater values can also be employed for the width w.

Figure 5A:
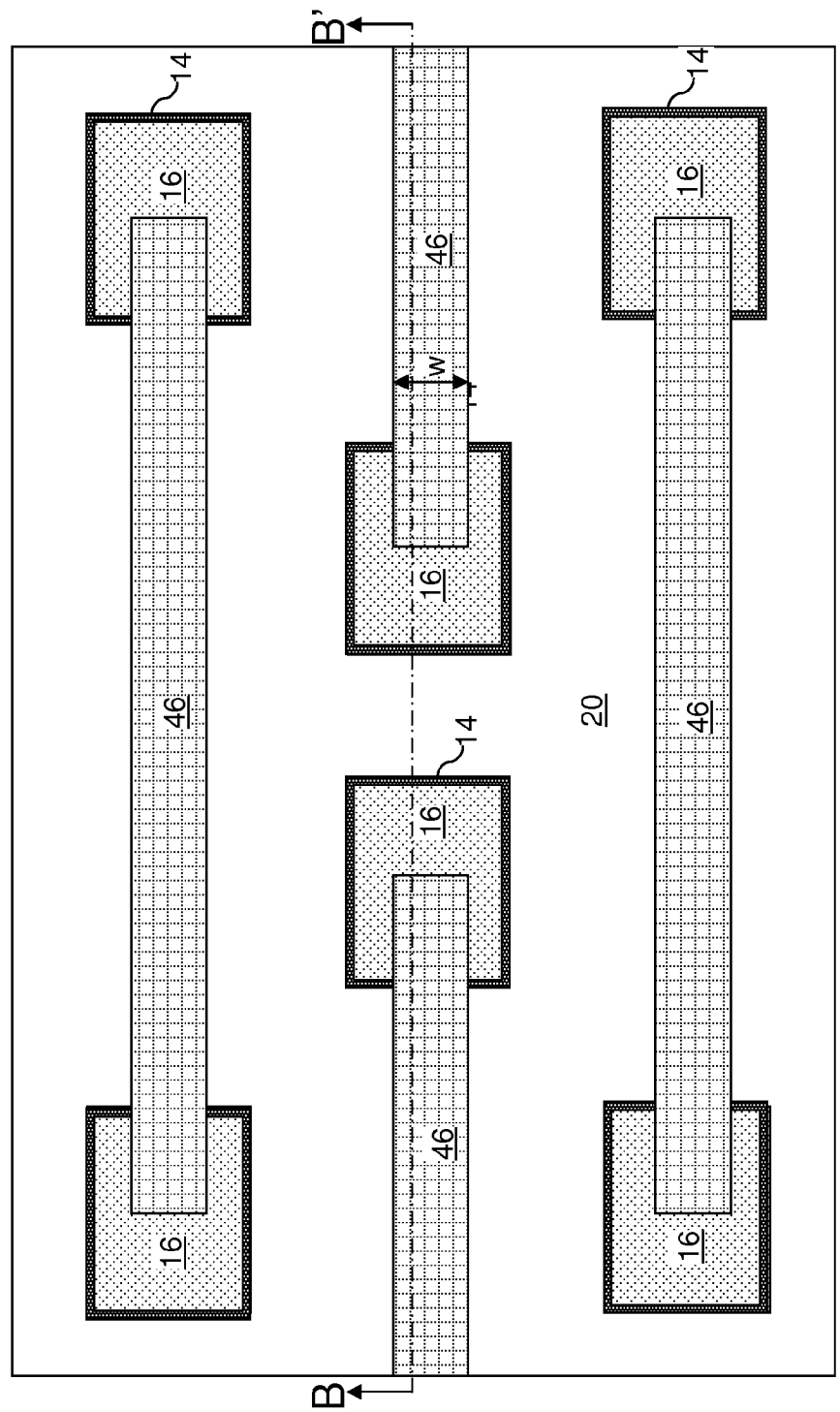
FIG. 5A is a top-down view of the exemplary semiconductor structure after patterning of a top semiconductor layer into patterned semiconductor material portions according to an embodiment of the present disclosure.
Figure 5B:
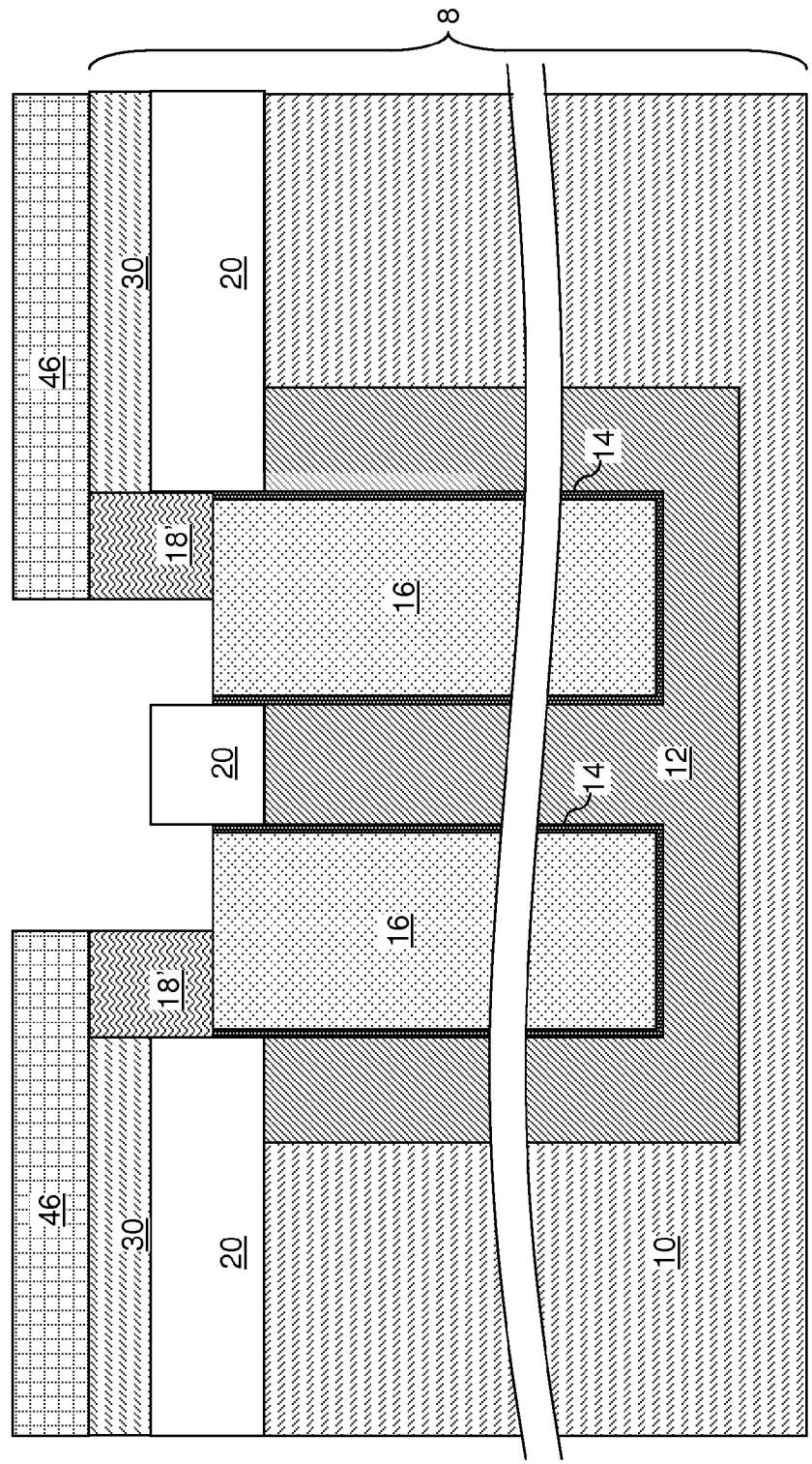
FIG. 5B is a vertical cross-sectional view of the exemplary semiconductor structure along the vertical plane B-B' of FIG. 5A.

Referring to FIGS. 5A and 5B, the top semiconductor layer 30L and the conductive cap structures 18 are patterned by transferring the pattern of the hardmask structures 46 into the top semiconductor layer 30L and the conductive cap structures 18. The pattern transfer can be effected, for example, by an anisotropic etch such as a reactive ion etch. The physically exposed portions of the top semiconductor layer 30L are removed so that a top surface of the buried insulator layer 20 is physically exposed after the pattern transfer. The physically exposed portions of the conductive cap structures 18 is removed so that a top surface of an inner electrode 16 and a top surface of a node dielectric 14 are physically exposed over each deep trench capacitor (12, 14, 16). A top surface of the buried insulator layer 20 and portions of top surfaces of each inner electrode 16 are physically exposed after the patterning of the top semiconductor layer 30L and the conductive cap structures 18.

The remaining portions of the top semiconductor layer 30L constitute semiconductor material portions 30. The remaining portions of the conductive cap structures 18 constitute conductive strap structures 18'. The semiconductor material portions 30 and the conductive strap structures 18' are formed as laterally contacting pairs of a semiconductor material portion 30 and a conductive strap structure 18'. In other words, each laterally contacting pair includes a semiconductor material portion 30 and a conductive cap structure 18'.

Each of the conductive strap structures 18' contacts, and overlies a portion of, an inner electrode 16 of the one of the trench capacitors. A bottom surface of each conductive strap structure 18' is in contact with an inner electrode 16 at a horizontal plane located between a horizontal plane including a top surface of the buried insulator layer 20 and a horizontal plane including a bottom surface of the buried insulator layer 20.

In one embodiment, the sidewalls of the hardmask structures 46 can be vertically coincident with the sidewalls of the semiconductor material portions 30 and with the sidewalls of the conductive strap structures 18'. In one embodiment, the semiconductor material portions 30 and the conductive strap structures 18' can have the same width w.

Figure 6A:
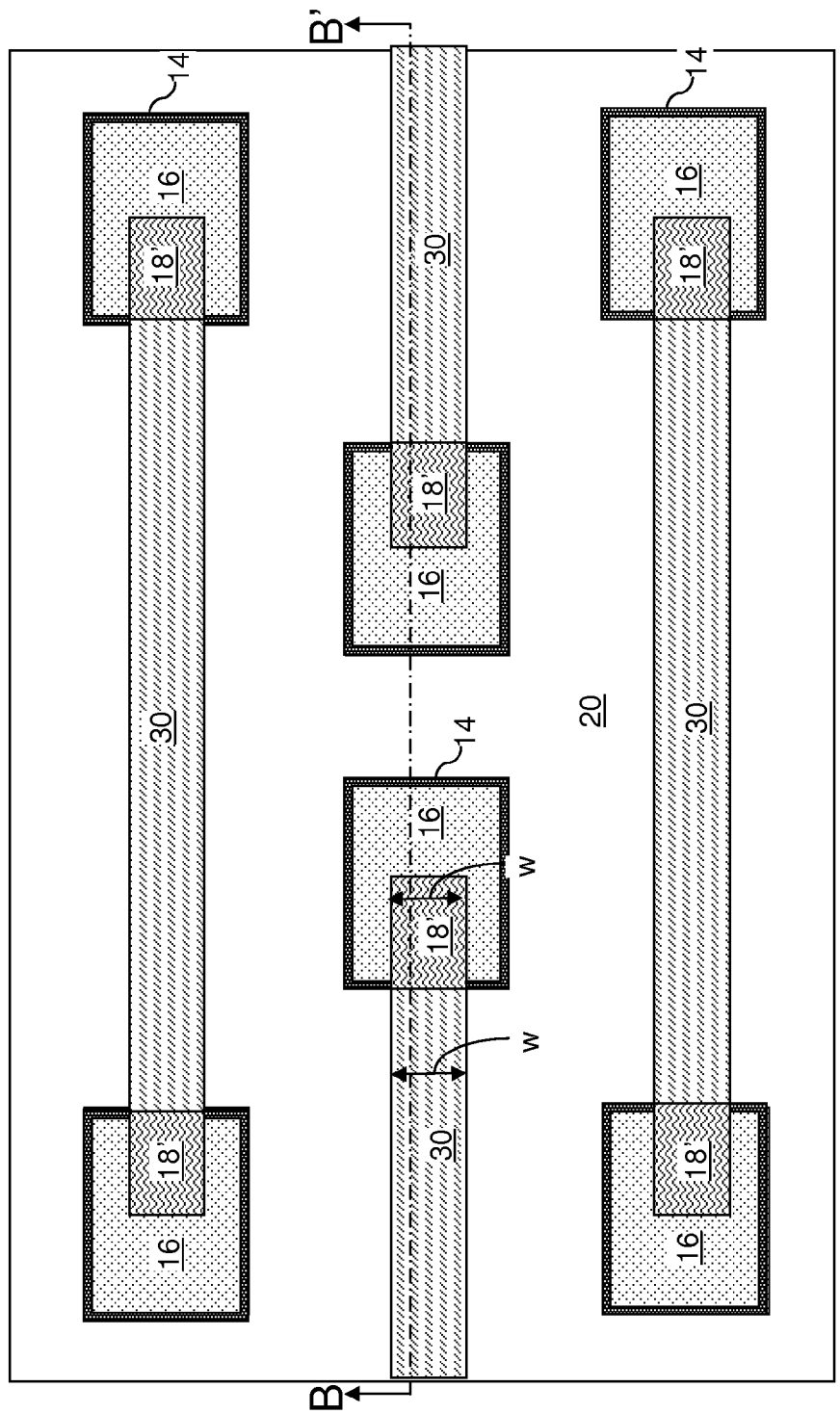
FIG. 6A is a top-down view of the exemplary semiconductor structure after removal of the hardmask structures according to an embodiment of the present disclosure.
Figure 6B:
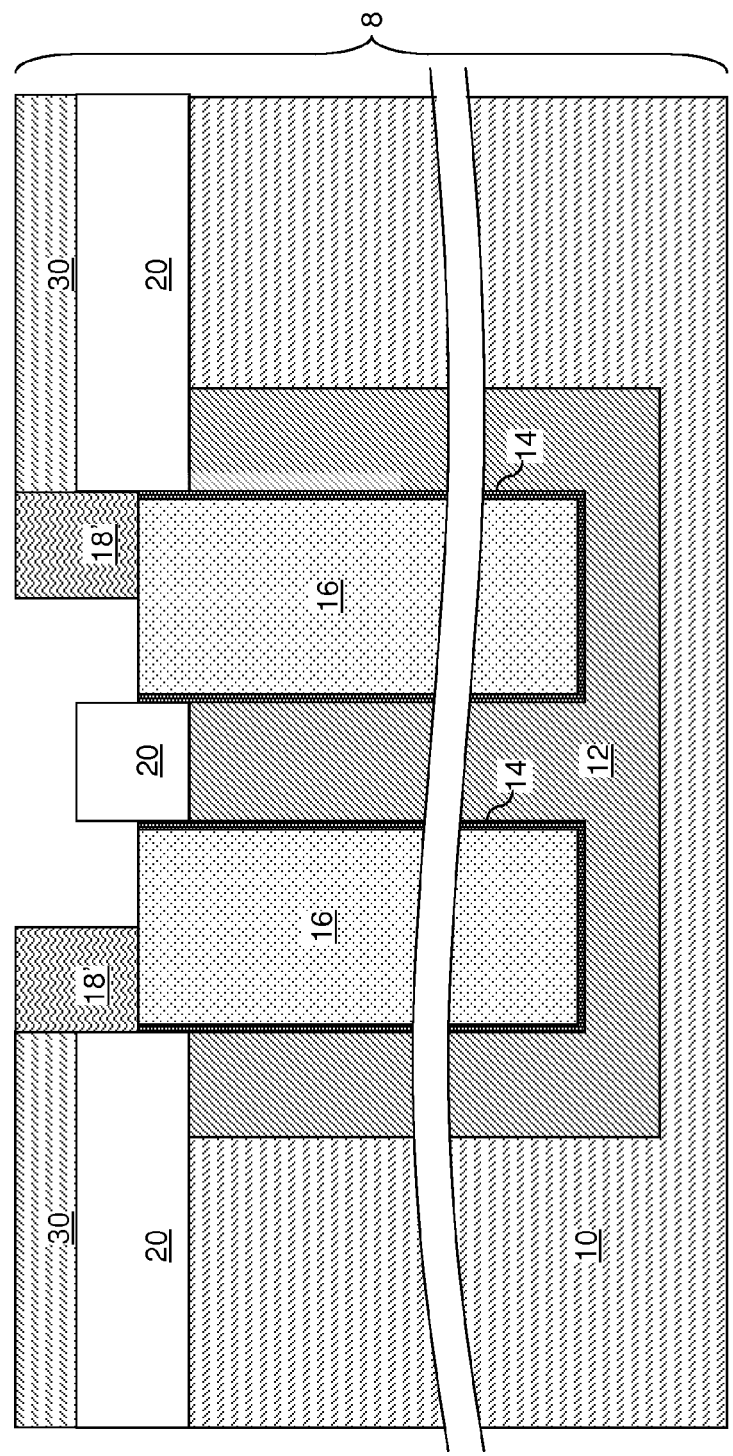
FIG. 6B is a vertical cross-sectional view of the exemplary semiconductor structure along the vertical plane B-B' of FIG. 6A.

Referring to FIGS. 6A and 6B, the hardmask structures 46 are removed selective to the semiconductor material portions 30 and the conductive strap structures 18', i.e., without substantially etching any of the semiconductor material portions 30 or the conductive strap structures 18'. The removal of the hardmask structure 46 can be selective to the inner electrodes 16 and/or the buried insulator layer 20.

The semiconductor material portions 30 and the conductive strap structures 18' have the same width w. The top surfaces of the conductive strap structures 18' can be coplanar with, located above, or located below, the top surfaces of the semiconductor material portions 30.

Figure 7A:
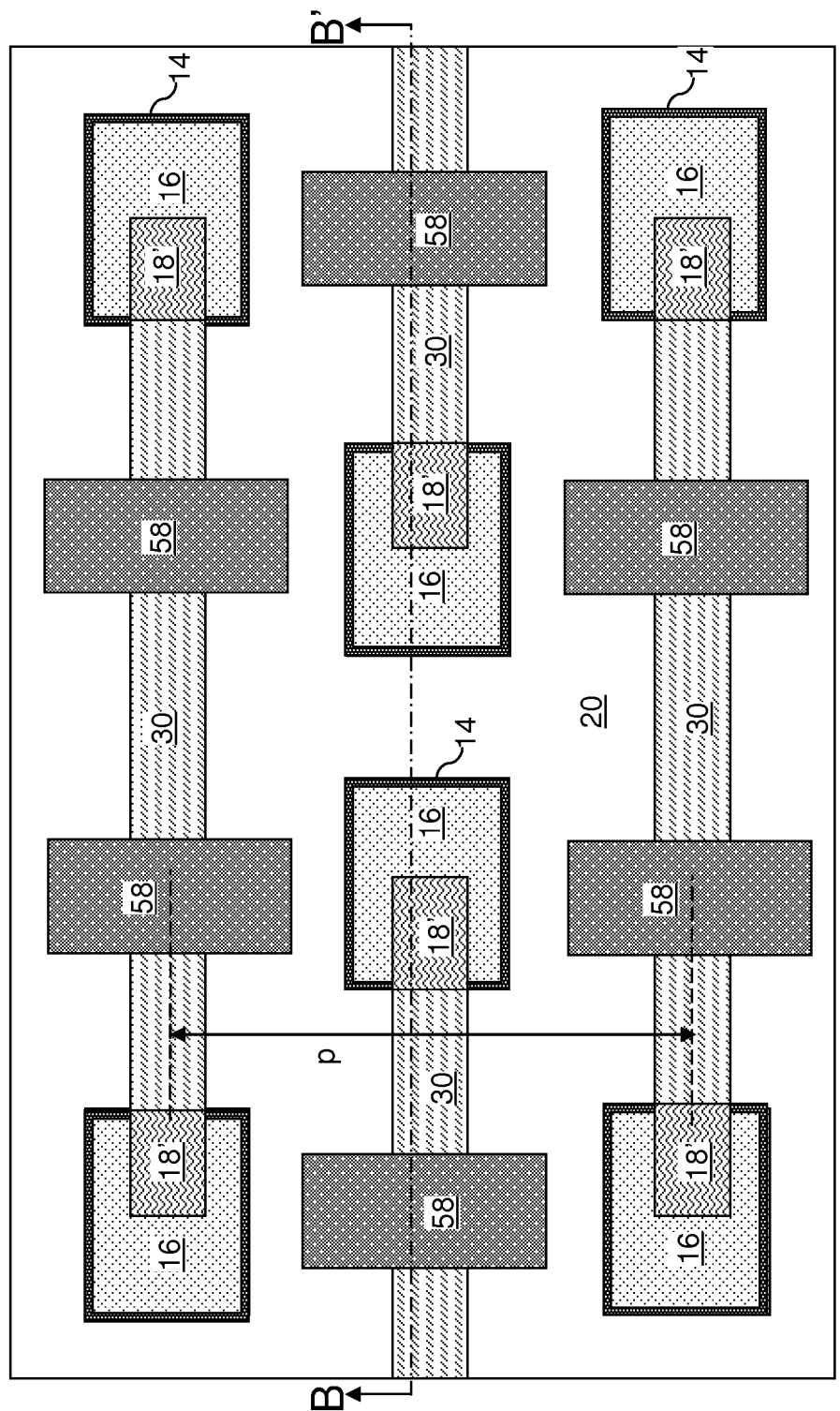
FIG. 7A is a top-down view of the exemplary semiconductor structure after formation of gate stacks according to an embodiment of the present disclosure.
Figure 7B:
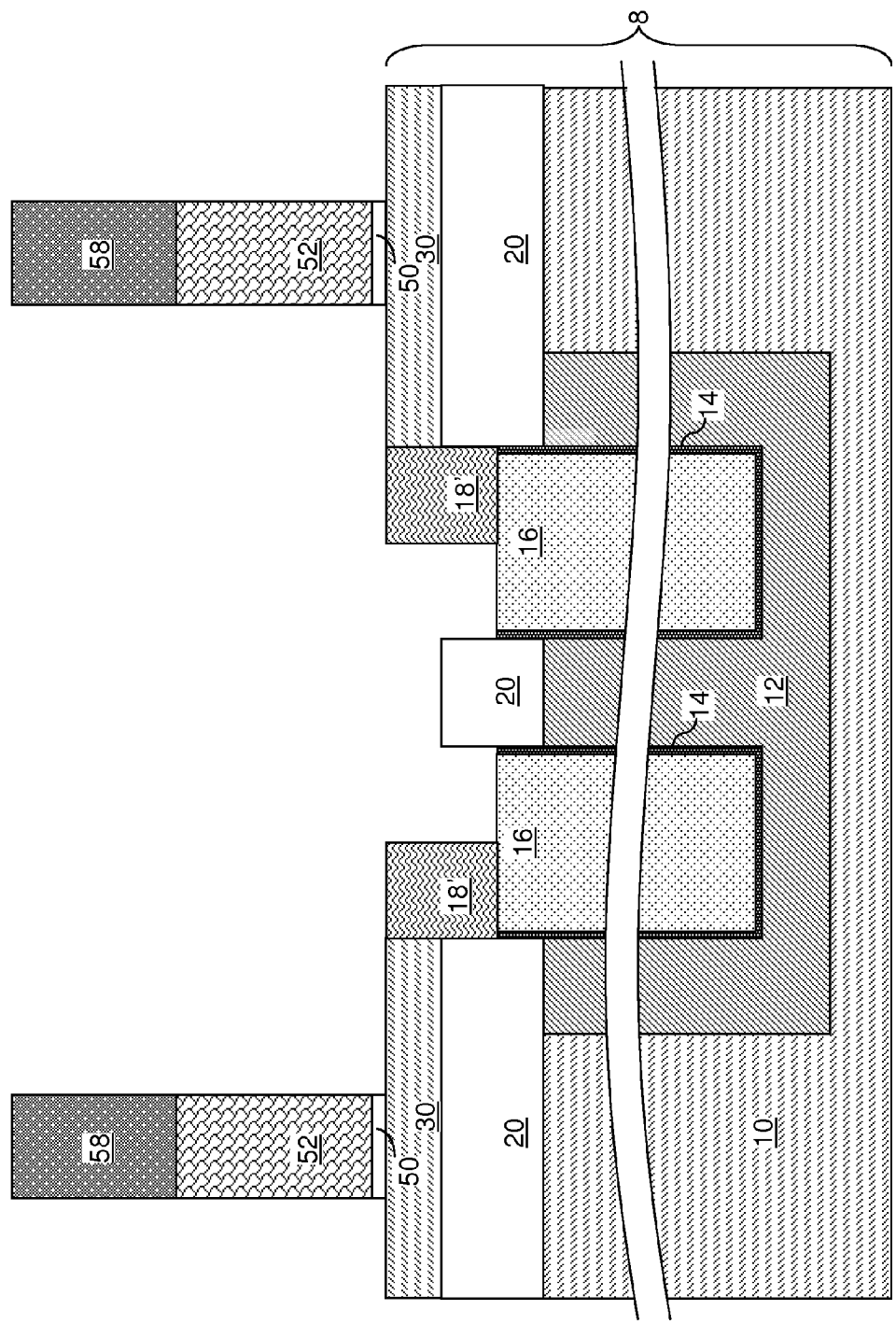
FIG. 7B is a vertical cross-sectional view of the exemplary semiconductor structure along the vertical plane B-B' of FIG. 7A.

Referring to FIGS. 7A and 7B, gate stacks are formed across sub-portions of the semiconductor material portions 30. Specifically, gate stack layers including a gate dielectric layer, a gate electrode layer, and a gate cap dielectric layer are deposited, and are subsequently lithographically patterned to form gate stacks.

For example, a gate dielectric layer can be formed at least on the semiconductor surfaces of the semiconductor material portions 30. In one embodiment, the gate dielectric layer can be formed by converting surface portions of the semiconductor material portions 30 into a dielectric semiconductor-containing material such as a dielectric semiconductor oxide, a dielectric semiconductor nitride, a dielectric semiconductor oxynitride, or a combination thereof. For example, if the semiconductor material portions 30 include silicon, the dielectric semiconductor-containing material can be silicon oxide, silicon nitride, silicon oxynitride, or a combination thereof. The thickness of the gate dielectric layer can be, for example, from 0.5 nm to 6 nm, although lesser and greater thicknesses can also be employed.

Alternately or additionally, the gate dielectric layer can be formed by depositing a dielectric material. In one embodiment, the material of the gate dielectric layer can be deposited by a conformal deposition method such as atomic layer deposition (ALD) and/or chemical vapor deposition (CVD). In one embodiment, the deposited dielectric material can include a dielectric semiconductor oxide such as silicon oxide. Alternately or additionally, the deposited dielectric material can include a dielectric metal oxide, a dielectric metal nitride, and/or a dielectric metal oxynitride. In one embodiment, the deposited dielectric material can include a high-dielectric constant (high-k) gate dielectric material known in the art.

Subsequently, a gate electrode layer and a dielectric gate cap layer can be deposited. The gate electrode layer includes a conductive material, which can include a doped semiconductor material, a metallic material, or combinations thereof. The gate electrode layer can be deposited, for example, by chemical vapor deposition (CVD), physical vapor deposition (PVD), or any other known method for depositing a conductive material. The thickness of the gate electrode layer, as measured in planar regions, can be from 20 nm to 300 nm, although lesser and greater thicknesses can also be employed.

The dielectric gate cap layer includes a dielectric material such as silicon nitride, silicon oxide, silicon oxynitride, and/or a dielectric metal oxide. The dielectric gate cap layer can be deposited, for example, by chemical vapor deposition. The thickness of the dielectric gate cap layer can be from 5 nm to 50 nm, although lesser and greater thicknesses can also be employed.

The gate dielectric layer, the gate electrode layer, and the dielectric gate cap layer are subsequently patterned to form the gate stacks. The dielectric gate cap layer, the gate electrode layer, and the gate dielectric layer are patterned, for example, by applying a photoresist layer (not shown) over the dielectric gate cap layer, patterning the photoresist layer by lithographic methods, and by transferring the pattern in the photoresist layer into the stack of the dielectric gate cap layer, the gate electrode layer, and the gate dielectric layer by an etch. The etch can include an anisotropic etch such as a reactive ion etch, which transfers the pattern in the photoresist layer into the stack of the dielectric gate cap layer and the gate electrode layer. The chemistry of the etch can be selected such that the material of the gate dielectric layer is not etched during the etching of the gate electrode layer. Thus, the etch can stop on the surface of the gate dielectric layer. Subsequently, an isotropic etch or an anisotropic etch can be employed the physically exposed portions of the gate dielectric layer.

Each remaining portion of the gate dielectric layer constitutes a gate dielectric 50, each remaining portion of the gate electrode layer constitutes a gate electrode 52, and each remaining portion of the dielectric gate cap layer constitutes a dielectric gate cap 58. In one embodiment, each gate stack includes a gate dielectric 50, a gate electrode 52, and a gate cap dielectric 58.

In one embodiment, each gate stack (50, 52, 58) straddles over a portion of a semiconductor material portion 30, and does not overlie any node dielectric 14 or any inner electrode 16. In one embodiment, gate stacks (50, 52, 58) is formed in areas located between a pair of deep trench capacitors that are laterally offset from each other by a lateral distance p that is the same as the pitch p of the deep trenches along the direction that is perpendicular to the lengthwise direction of the semiconductor material portions 30. In one embodiment, each gate stack (50, 52, 58) extends along the direction perpendicular to the lengthwise direction of the semiconductor material portions 30 by a length that does not exceed the pitch p of the semiconductor material portions 30 and the deep trenches.

Figure 8A:
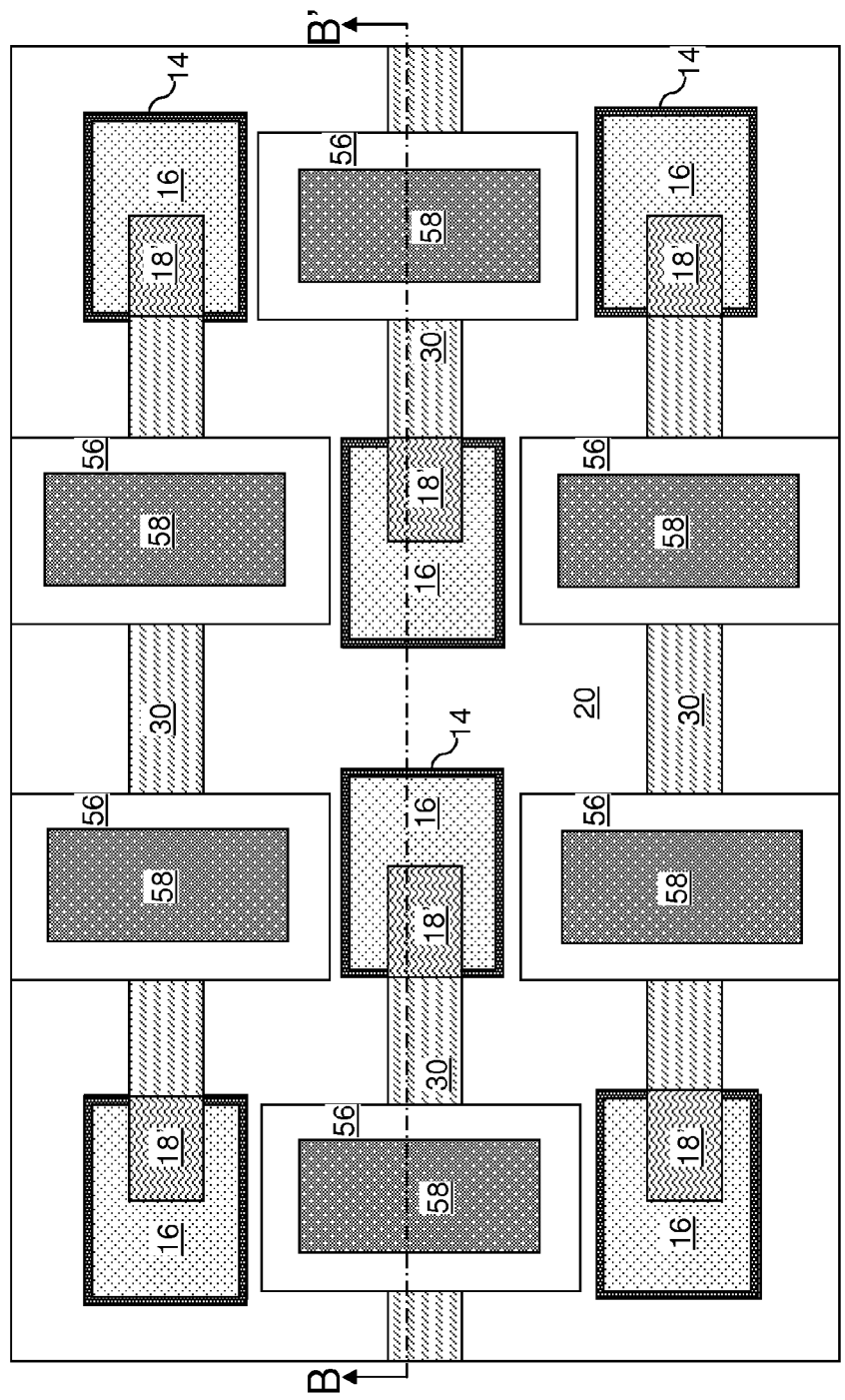
FIG. 8A is a top-down view of the exemplary semiconductor structure after formation of gate spacers according to an embodiment of the present disclosure.
Figure 8B:
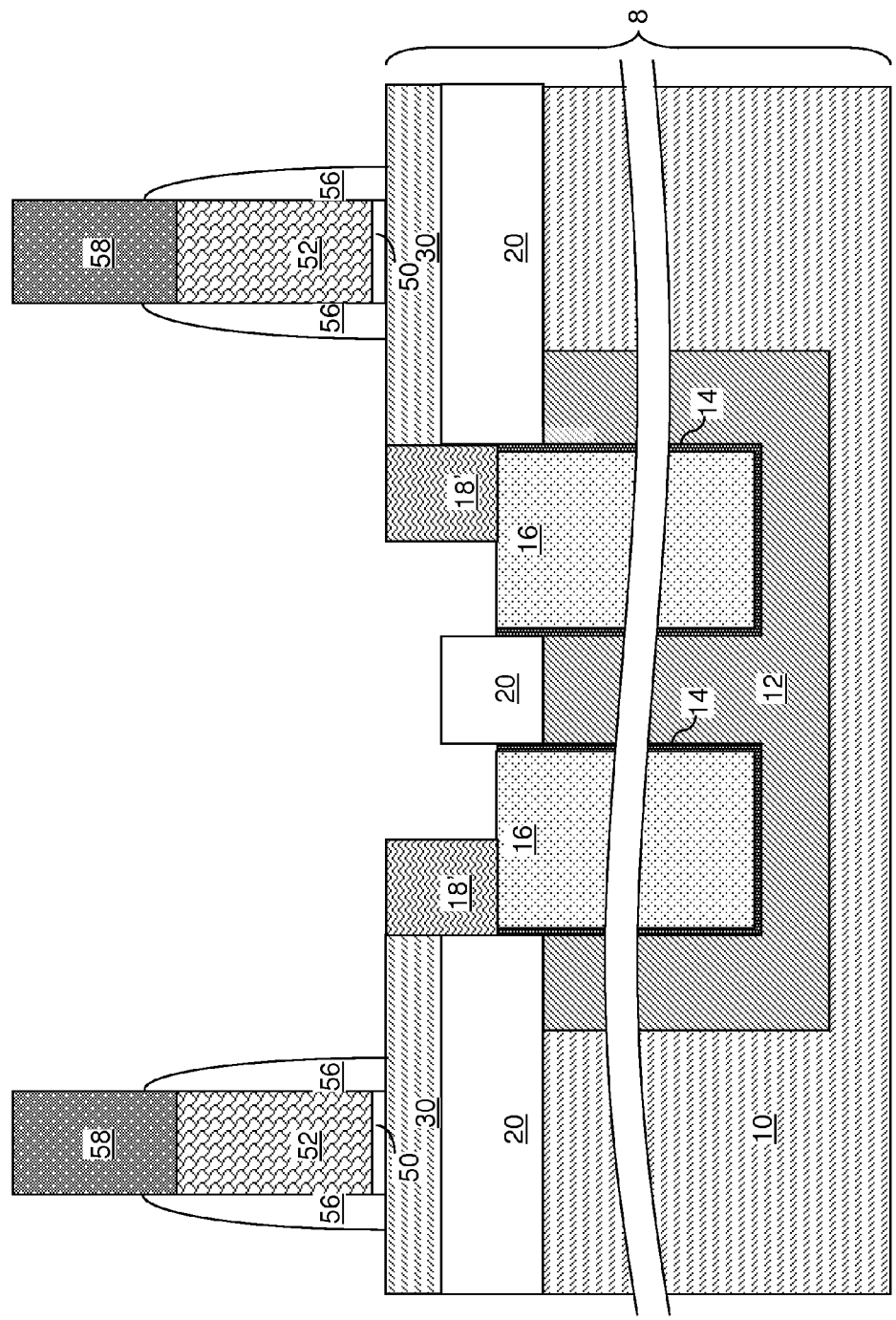
FIG. 8B is a vertical cross-sectional view of the exemplary semiconductor structure along the vertical plane B-B' of FIG. 8A.

Referring to FIGS. 8A and 8B, gate spacers 56 are formed, for example, by depositing a conformal dielectric material layer and etching horizontal portions of the conformal dielectric material layer by an anisotropic etch such as a reactive ion etch. The conformal dielectric material layer includes a dielectric material such as silicon oxide, silicon nitride, silicon oxynitride, or a combination thereof. The conformal dielectric material layer can be deposited, for example, by chemical vapor deposition or atomic layer deposition. The lateral thickness of the gate spacers 56, as measured at the base, can be from 3 nm to 100 nm, although lesser and greater thicknesses can also be employed.

In one embodiment, the anisotropic etch can be extended after removal of horizontal portions of the conformal dielectric material layer to remove vertical portions of the conformal dielectric material layer from the sidewalls of the semiconductor material portions 30 and the conductive strap structures 18'. The chemistry of the anisotropic etch can be selected so that the anisotropic etch does not remove the materials of the semiconductor material portions 30 and the conductive strap structures 18'. For example, an etch chemistry that removes a dielectric material selective to semiconductor materials and/or metallic materials can be employed for the anisotropic etch. In one embodiment, two gate stacks can straddle a semiconductor material portion 30.

Figure 9A:
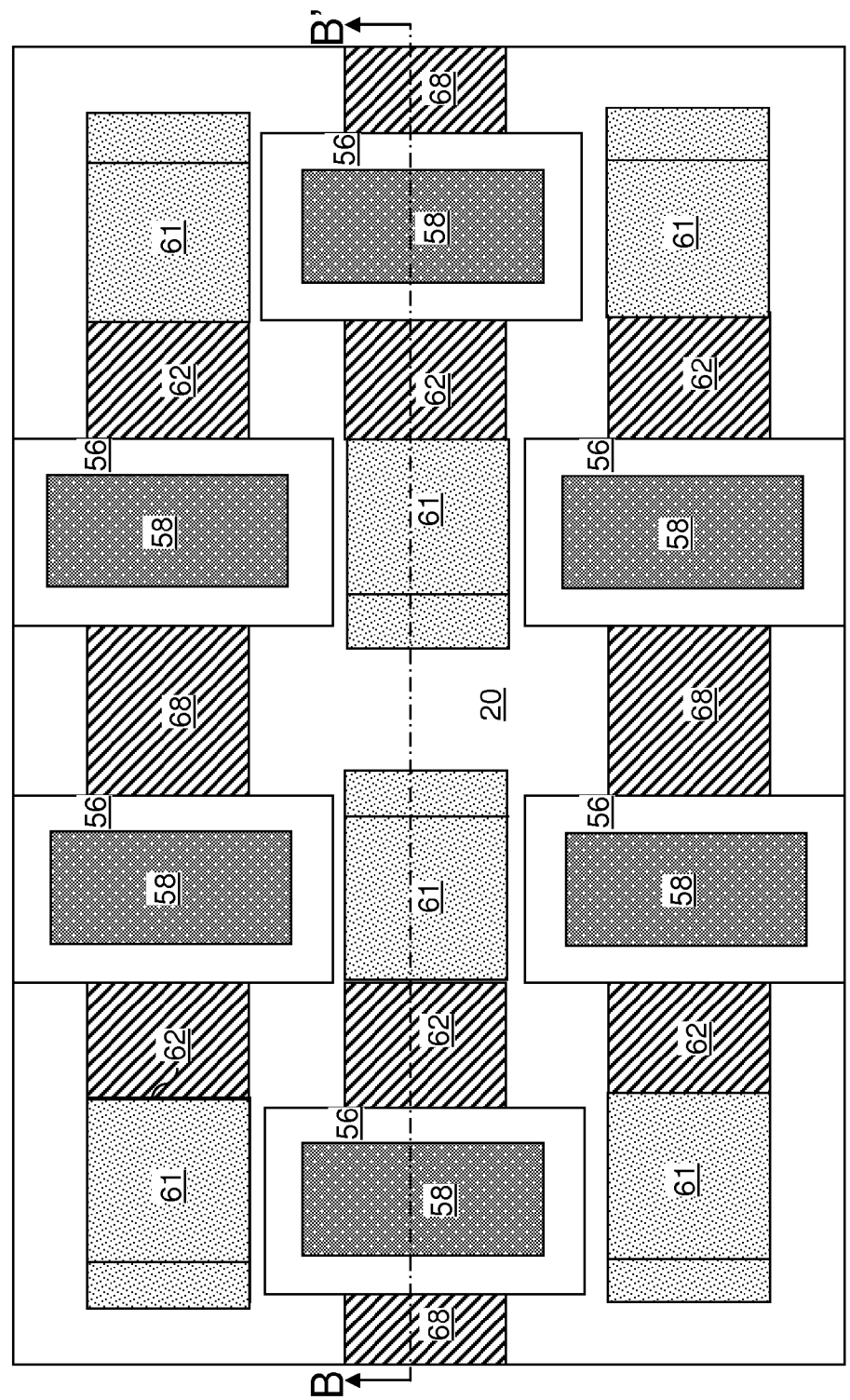
FIG. 9A is a top-down view of the exemplary semiconductor structure after formation of raised source/drain regions and outer conductive strap structures according to an embodiment of the present disclosure.
Figure 9B:
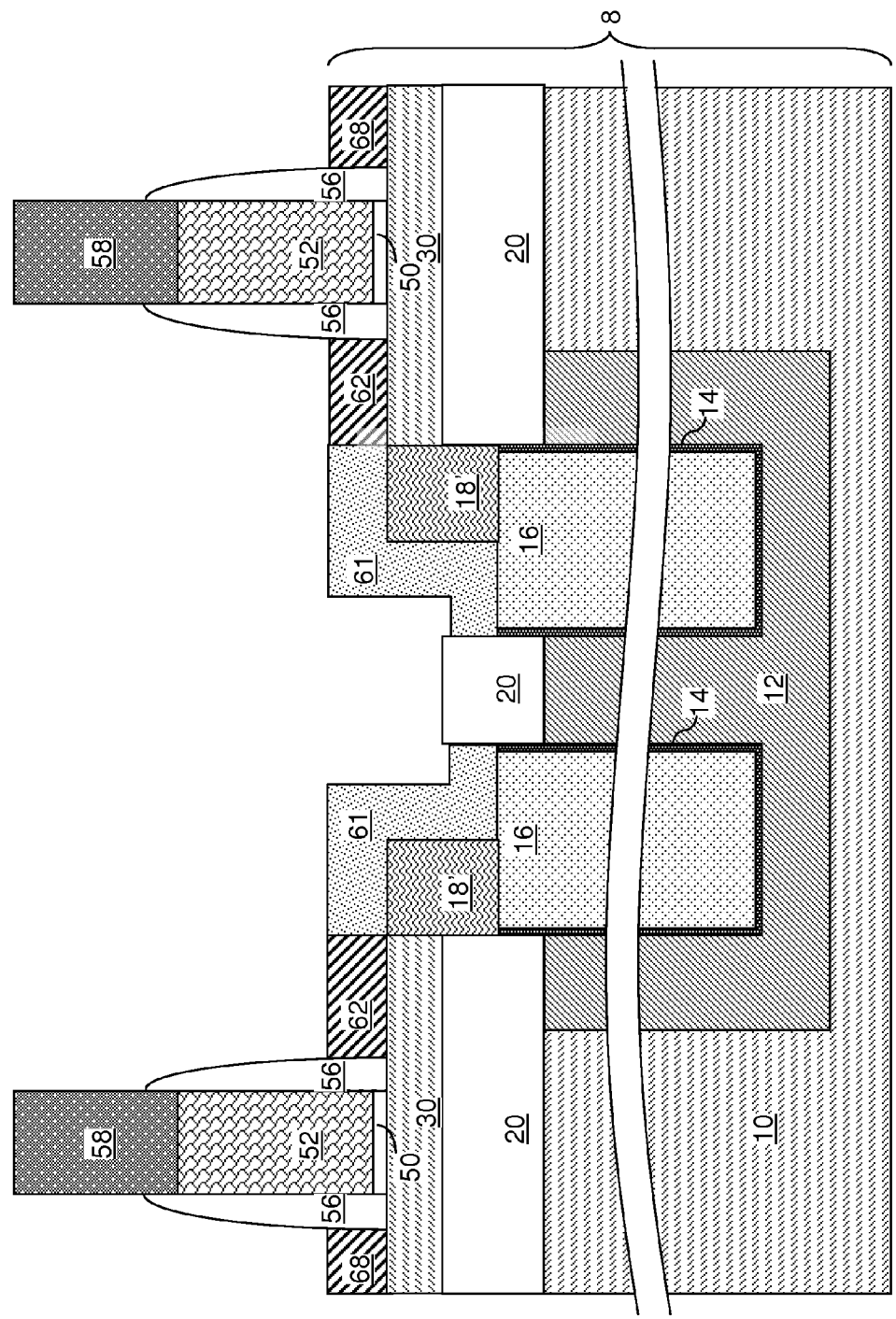
FIG. 9B is a vertical cross-sectional view of the exemplary semiconductor structure along the vertical plane B-B' of FIG. 9A.

Referring to FIGS. 9A and 9B, selective epitaxy can be optionally performed to form raised source regions 62, raised drain regions 68, and outer conductive strap structures 61. In one embodiment, the raised source regions 62 can be formed on surfaces of the semiconductor material portions 30 located between each conductive strap structure 18' and an outer sidewall of a gate spacer 56 that is most proximate to the strap structure 18'. The raised drain regions 68 can be formed on sidewalls of semiconductor material portions 30 located between a pair of gate spacers 56 located on each semiconductor material portion 30. The outer conductive strap structures 61 can be formed on the surfaces of each conductive strap structures 18'.

The raised source regions 62, the raised drain regions 68, and the outer conductive strap structures 61 can be formed, for example, by depositing a semiconductor material employing a selective epitaxy process. In a selective epitaxy process, a semiconductor-containing reactant gas and an etchant gas are simultaneously, or alternately, flowed into a process chamber to deposit a semiconductor material on semiconductor surfaces, while not depositing any semiconductor material on dielectric surfaces.

In one embodiment, each raised source region 62 and each raised drain region 68 can be formed as a single crystalline semiconductor material portion that is in epitaxial alignment with a single crystalline semiconductor material within the semiconductor material portion 30 that contacts the raised source region 62 and/or the raised drain region 68. The outer conductive strap structures 61 can be formed as polycrystalline semiconductor material portions.

In one embodiment, the raised source regions 62, the raised drain regions 68, and the outer conductive strap structures 61 can be formed with in-situ doping of p-type dopants or n-type dopants. The dopants employed to dope the raised source regions 62, the raised drain regions 68, and the outer conductive strap structures 61 can be dopants of the opposite conductivity type relative to the dopants present within the semiconductor material portions 30. For example, if the semiconductor material portions 30 have a p-type doping, the dopants introduced into the raised source regions 62, the raised drain regions 68, and the outer conductive strap structures 61 can be n-type dopants, and vice versa. In another embodiment, the raised source regions 62, the raised drain regions 68, and the outer conductive strap structures 61 can be formed as undoped semiconductor material portions, and electrical dopants can be subsequently introduced into the source regions 62 and the drain regions 64, for example, by ion implantation.

Each raised source region 62 can laterally contact a sidewall of a conductive strap structure 61. In one embodiment, the raised source regions 62, the raised drain regions 68, and the outer conductive strap structures 61 can include a same semiconductor material, and the raised source regions 62 and the raised drain regions 68 can be single crystalline, and the outer conductive strap structures 61 can be polycrystalline. Each outer conductive strap structure 61 contacts a top surface of an inner electrode 16 and sidewalls and a top surface of a conductive strap structure 18'.

The thicknesses of the raised source regions 62, the raised drain regions 68, and the outer conductive strap structures 61, as measured above a top surface of a semiconductor material portion 30 or above a top surface of a contact strap structure 18', can be from 1 nm to 50 nm, although lesser and greater thicknesses can also be employed.

Figure 10A:
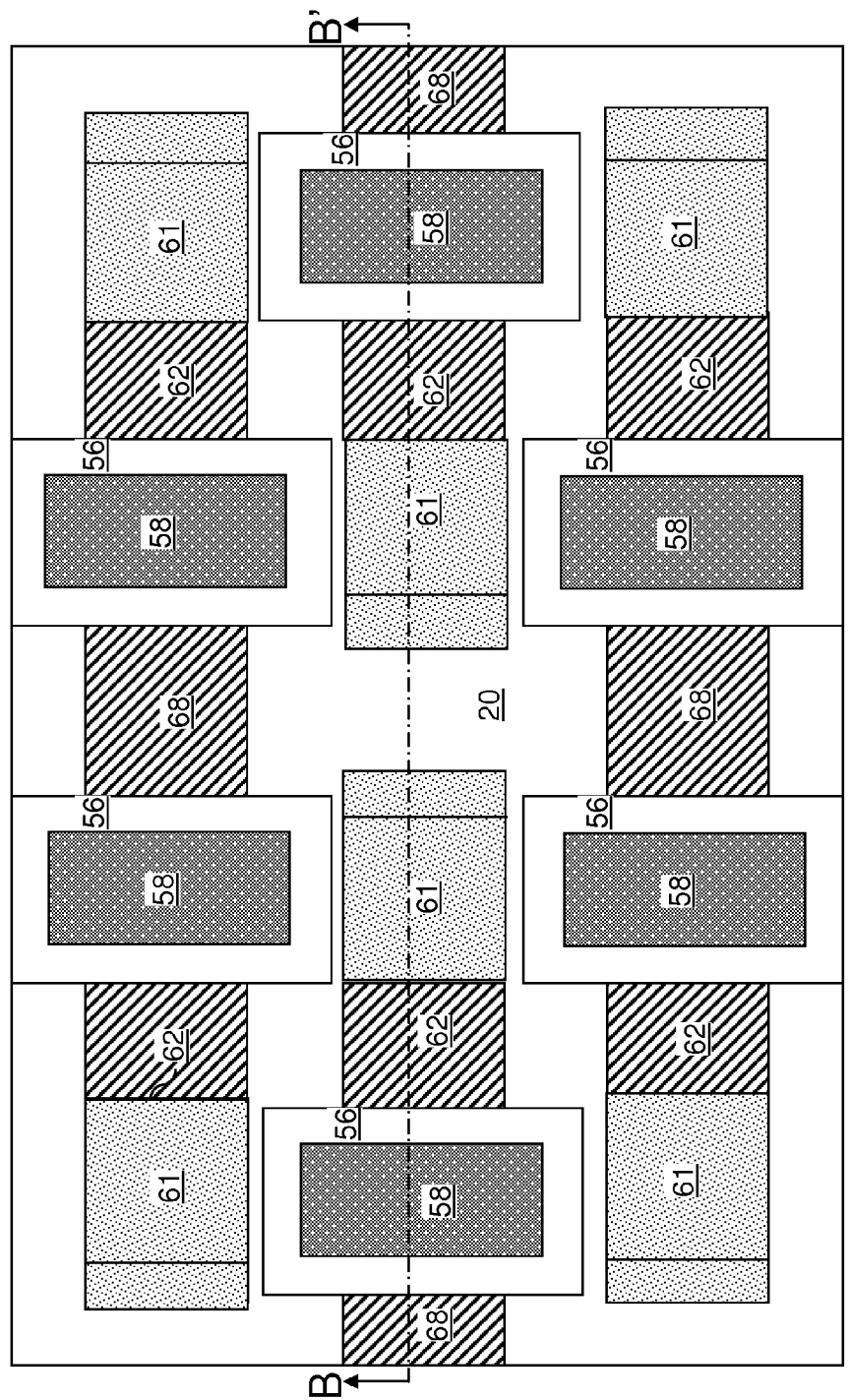
FIG. 10A is a top-down view of the exemplary semiconductor structure after formation of inner source/drain regions according to an embodiment of the present disclosure.
Figure 10B:
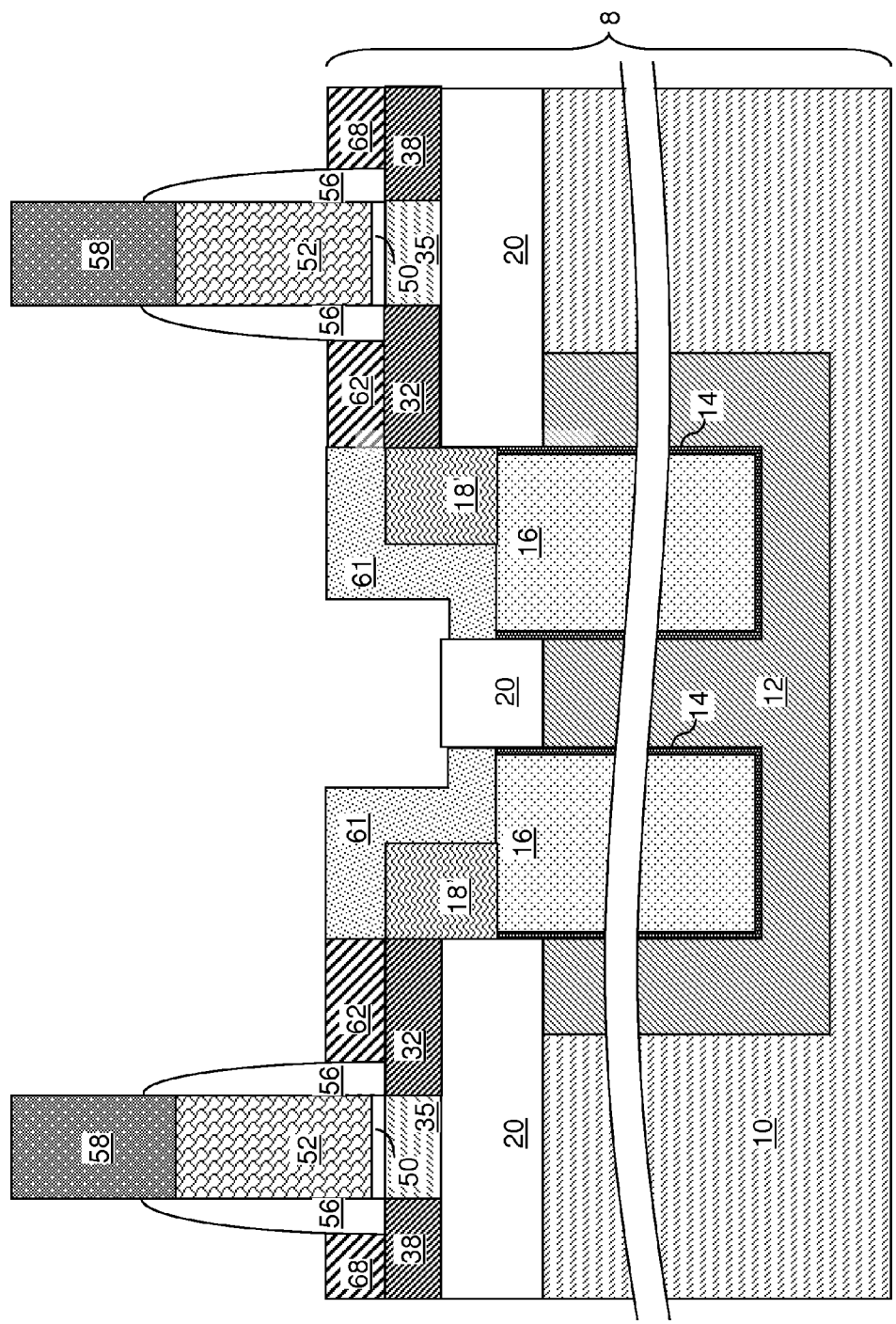
FIG. 10B is a vertical cross-sectional view of the exemplary semiconductor structure along the vertical plane B-B' of FIG. 10A.

Referring to FIGS. 10A and 10B, an anneal is performed at an elevated temperature to induce diffusion of the electrical dopants, i.e., p-type dopants or n-type dopants, in the raised source regions 62 and the raised drain regions 68 into underlying sub-portions of the semiconductor material portions. The sub-portions of the semiconductor material portions 30 that are doped with dopants from the raised source regions 62 or from the raised drain regions 68 become inner source regions 32 or inner drain regions 38, respectively. The remaining sub-portion of each semiconductor material portion 30 that is not converted into an inner source region 32 or an inner drain region 38 is a body region 32 of a field effect transistor, which is an access transistor that controls the flow of electrical charges into, and out of, the inner electrode 16 of a trench capacitor to which the access transistor is connected. A p-n junction can be formed between each adjoining pair of a body region 32 and an inner source region 32. Another p-n junction can be formed between each adjoining pair of a body region 32 and an inner drain region 38.

Each access transistor includes an inner source region 32 and an inner drain region 38 that are located in a semiconductor material portion (32, 35, 38) that overlies the buried insulator layer 20 in the substrate 8. The inner source region 32 is a portion of a source region (32, 62) that is in contact with a conductive strap structure 18'. Each access transistor includes a gate electrode 52 overlying a body region 35 of the semiconductor material portion (32, 35, 38).

In an embodiment in which the raised source regions 62, the raised drain regions 68, and the outer conductive strap structures 61 are not formed, source regions can be formed where inner source regions 32 are present and drain regions can be formed where inner drain regions 38 are present, for example, ion implantation of dopants.

Optionally, various metal semiconductor alloy regions (not shown) can be formed on the raised drain regions 68 and/or on the gate electrodes 52. If metal semiconductor alloy regions are formed on the gate electrodes 52, the gate cap dielectrics 58 can be removed prior to forming such metal semiconductor alloy regions.

Figure 11A:
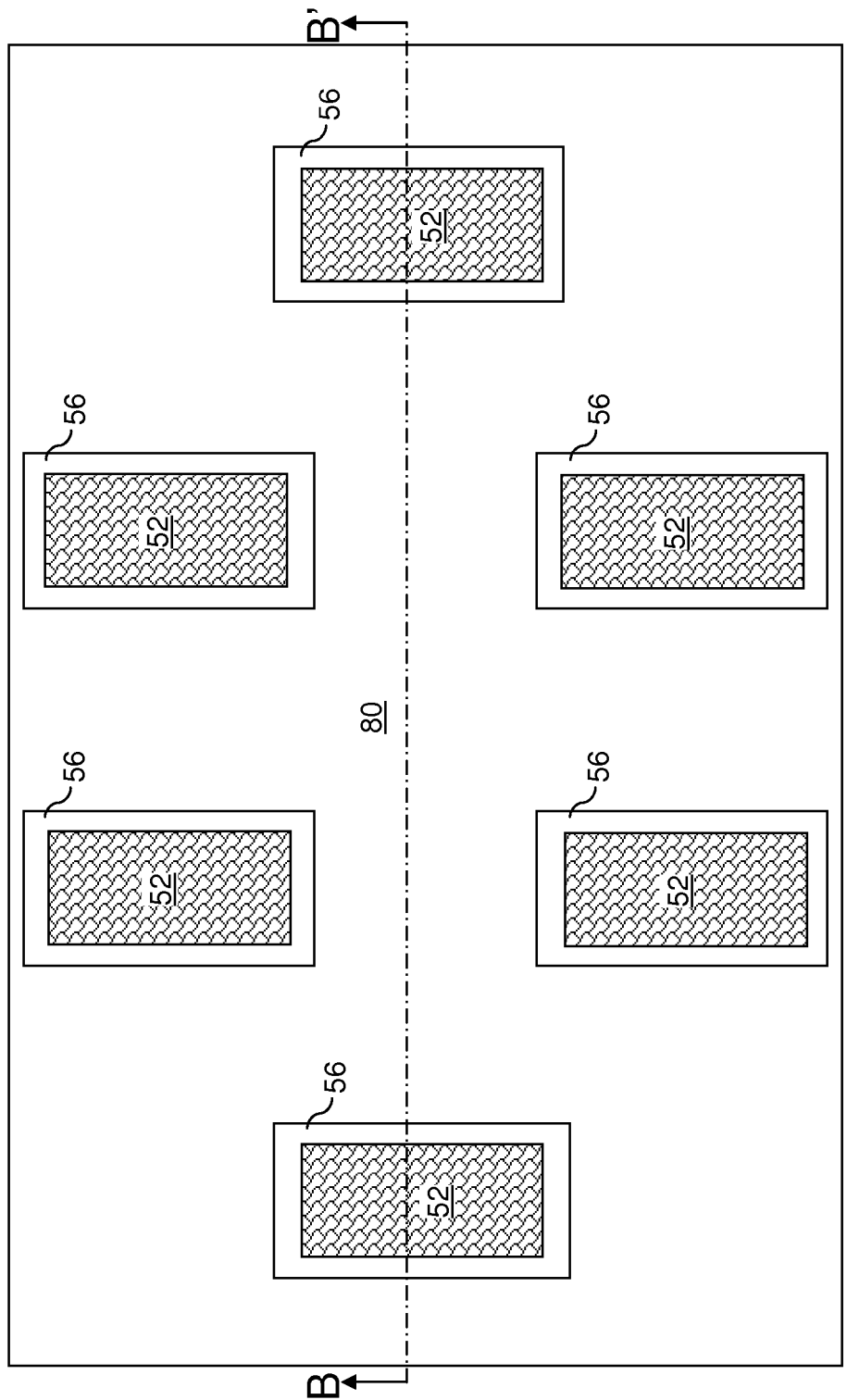
FIG. 11A is a top-down view of the exemplary semiconductor structure after deposition and planarization of a contact-level dielectric layer according to an embodiment of the present disclosure.
Figure 11B:
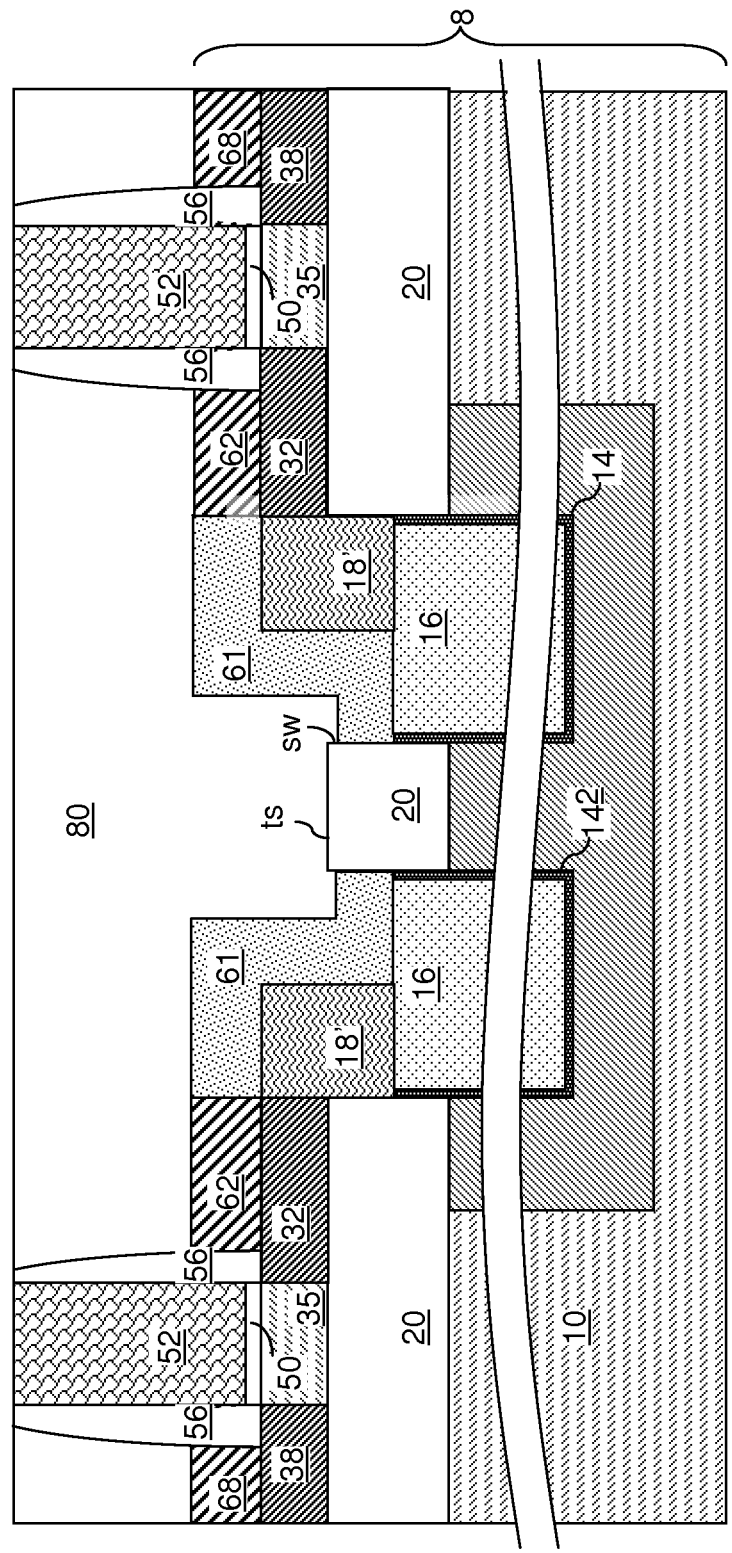
FIG. 11B is a vertical cross-sectional view of the exemplary semiconductor structure along the vertical plane B-B' of FIG. 11A.

Referring to FIGS. 11A and 11B, a contact-level dielectric layer 80 including a dielectric material is deposited, for example, by chemical vapor deposition. The dielectric material of the contact-level dielectric layer 80 can include, for example, silicon oxide, silicon nitride, porous or non-porous organosilicate glass, or combinations thereof.

In one embodiment, the contact-level dielectric layer 80 can be deposited directly on a top surface ts of the buried insulator layer 20. In this case, the top surface ts of the buried insulator layer 20 can be in contact with a bottom surface of the contact-level dielectric layer 80. Further, the contact-level dielectric layer can be in contact with a sidewall sw of a portion of the buried insulator layer 20 that is vertically coincident with a sidewall of an outer conductive strap structure 61.

After deposition of the contact-level dielectric layer 80, the top surface of the contact-level dielectric layer 80 can be planarized, for example, by chemical mechanical planarization (CMP). In one embodiment, the planarization of the contact-level dielectric layer 80 can proceed until the gate dielectric gate caps 58 are removed, and top surfaces of the gate electrodes 52 are physically exposed. The contact-level dielectric layer 80 can embed the gate electrodes 52. A top surface of each gate electrode 52 can be coplanar with the planarized top surface of the contact-level dielectric layer 80.

Figure 12A:
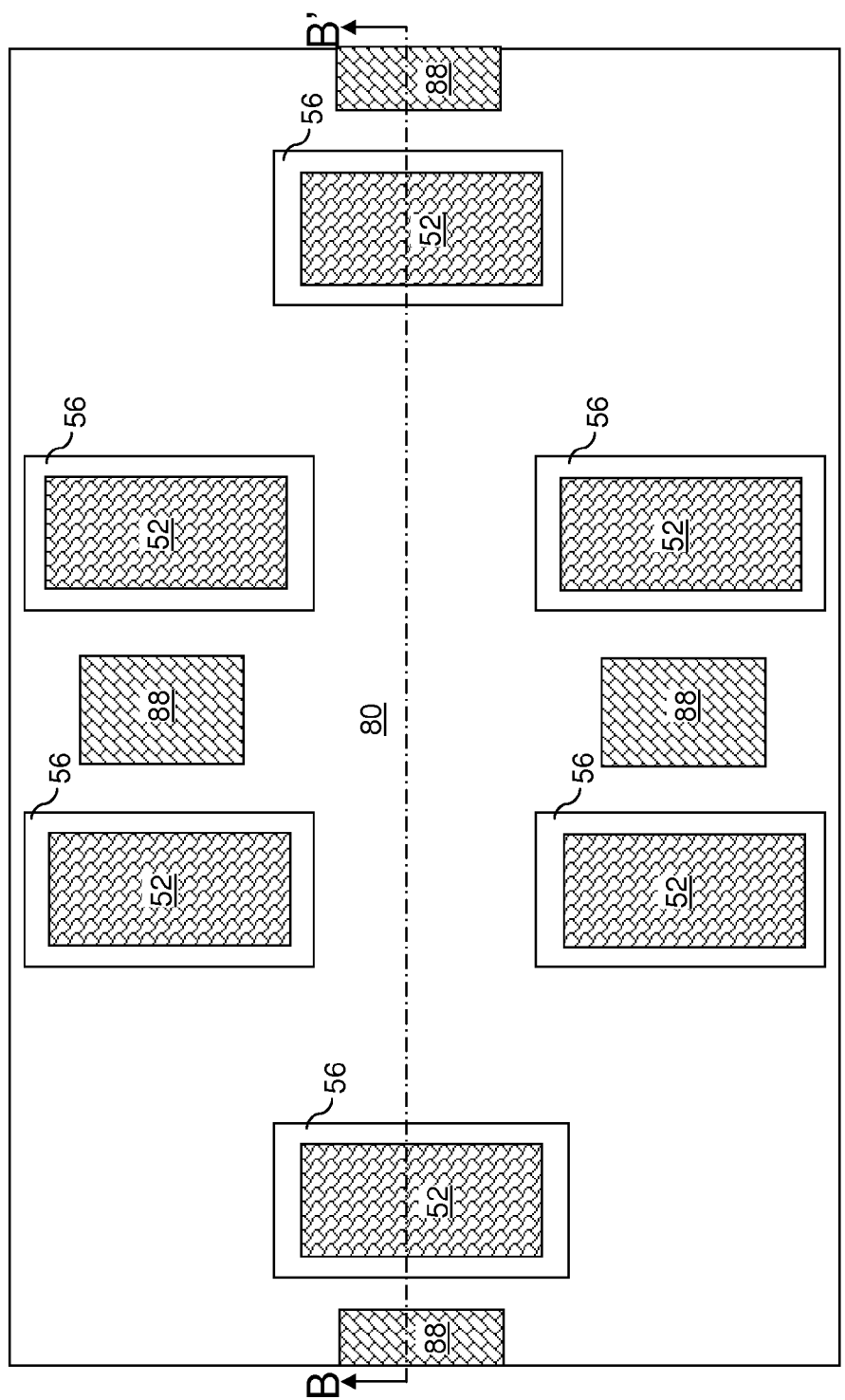
FIG. 12A is a top-down view of the exemplary semiconductor structure after formation of drain contact via structures according to an embodiment of the present disclosure.
Figure 12B:
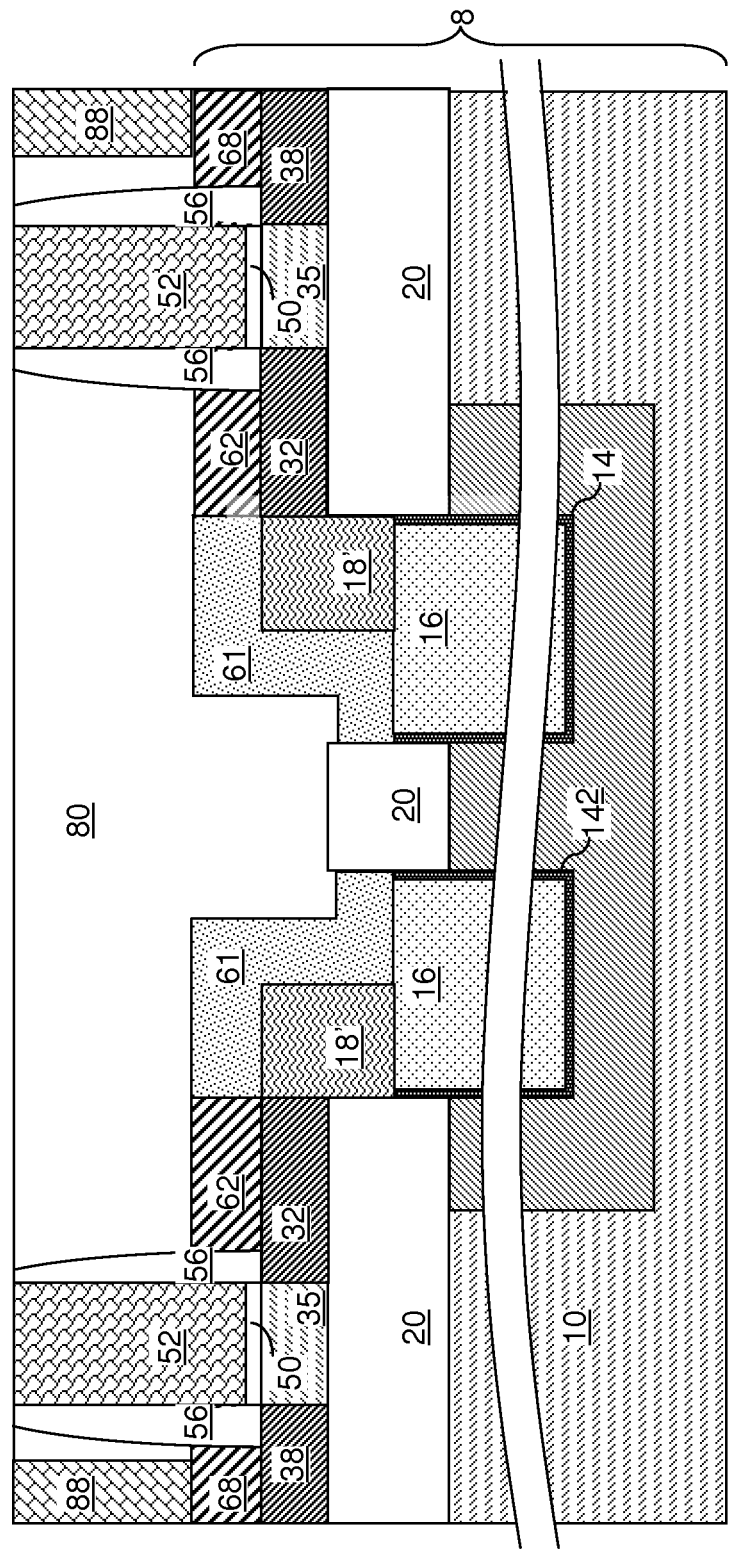
FIG. 12B is a vertical cross-sectional view of the exemplary semiconductor structure along the vertical plane B-B' of FIG. 12A.

Referring to FIGS. 12A and 12B, drain contact via structures 88 can be formed, for example, by forming drain via cavities over each raised drain region 68, and by filling the drain via cavities with a conductive material. For example, a photoresist layer (not shown) can be applied over the top surface of the contact-level dielectric layer 80 and the physically exposed surfaces of the gate electrodes 52. The photoresist layer is lithographically patterned to form openings therein over areas of the raised drain regions 68. The pattern in the photoresist layer can be transferred through the contact-level dielectric layer 80 by an anisotropic etch. Top surfaces of the raised drain regions 68 (or top surfaces of the inner drain regions 38 if the raised drain regions 68 are not formed) are physically exposed underneath the drain via cavities. The photoresist layer can be subsequently removed, for example, by ashing. The drain via cavities are filled with a conductive material, which can be deposited, for example, by physical vapor deposition (PVD) and/or chemical vapor deposition. Excess portions of the deposited conductive material are removed from above the top surface of the contact-level dielectric layer 80, for example, by planarization. The remaining conductive materials constitute the drain contact via structures 88.

Figure 13A:
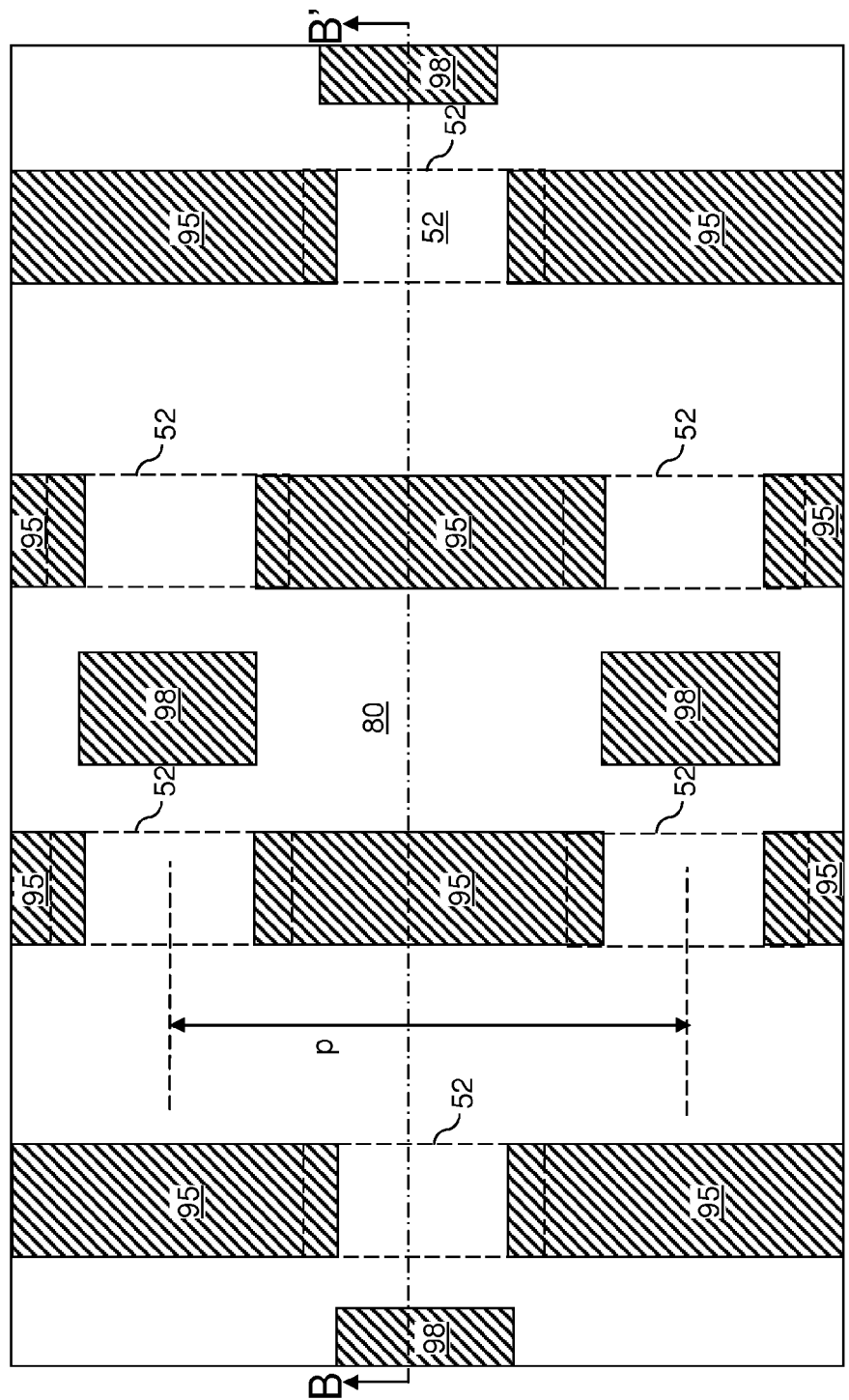
FIG. 13A is a top-down view of the exemplary semiconductor structure after formation of passing gate lines according to an embodiment of the present disclosure.
Figure 13B:
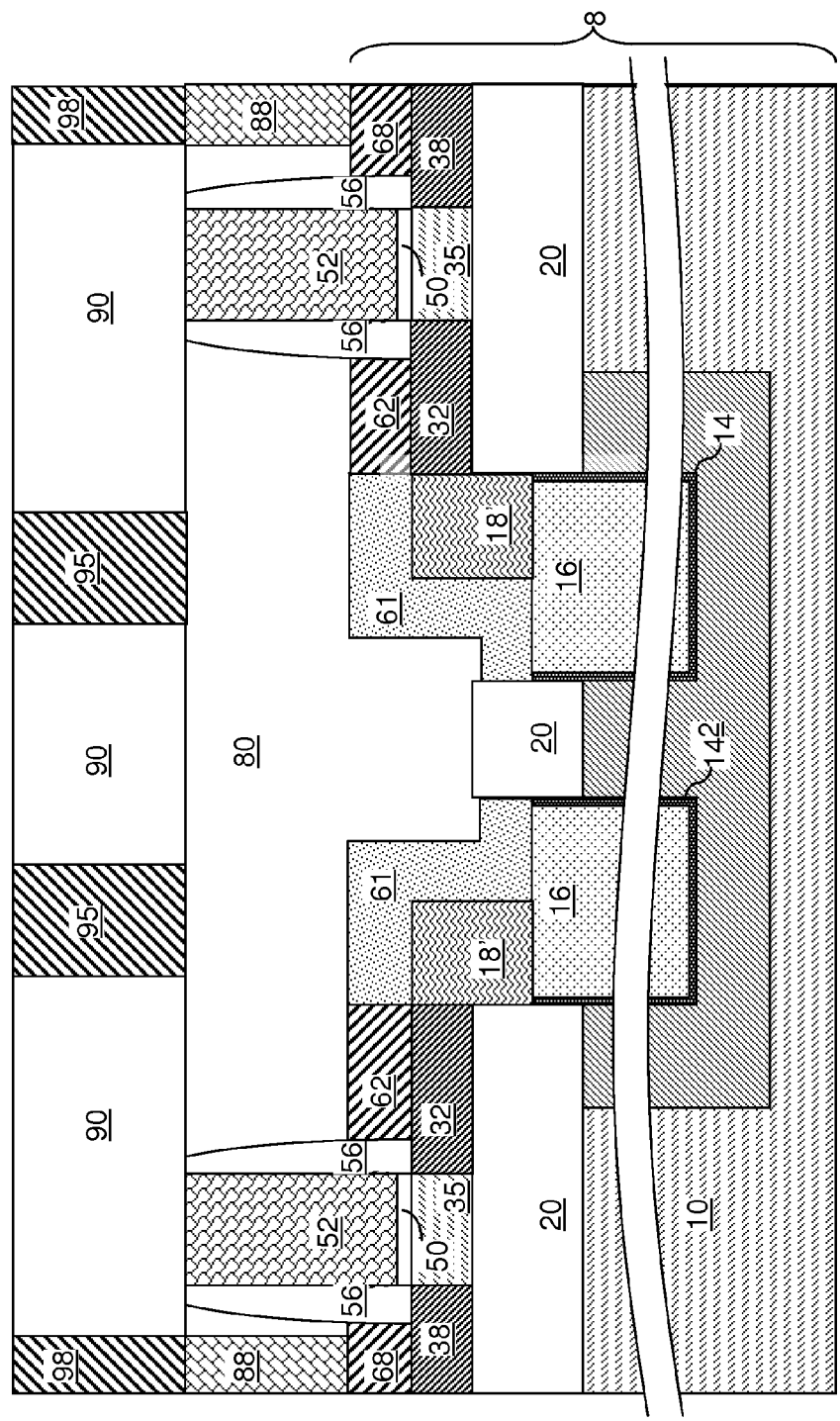
FIG. 13B is a vertical cross-sectional view of the exemplary semiconductor structure along the vertical plane B-B' of FIG. 13A.

Referring to FIGS. 13A and 13B, a line-level dielectric layer 90 can be deposited over the contact-level dielectric layer 80 as a planar layer, i.e., a layer having a same thickness throughout. The line-level dielectric layer 90 includes a dielectric material such as doped or undoped silicon oxide, silicon nitride, silicon oxynitride, a porous or non-porous organosilicate glass, a nitrogen-doped porous or non-porous organosilicate glass, or a combination thereof. The line-level dielectric layer 90 can be deposited, for example, by chemical vapor deposition. The thickness of the line-level dielectric layer 90 can be from 50 nm to 300 nm, although lesser and greater thicknesses can also be employed.

Various line cavities can be formed in the line-level dielectric layer 90, for example, by applying a photoresist layer (not shown) over the line-level dielectric layer 90, by lithographically patterning the photoresist layer by lithographic exposure and development, and transferring the pattern in the patterned photoresist layer into the line-level dielectric layer 90 by an etch, which can be an anisotropic etch such as a reactive ion etch. The patterned photoresist layer can be removed selective to the line-level dielectric layer 90 and the contact-level dielectric layer 80, for example, by ashing. Top surfaces of gate electrodes 52 and top surfaces of drain contact via structures 88 are physically exposed underneath the line cavities.

The line cavities can be formed such that a peripheral portion of a top surface of a first gate electrode and a peripheral portion of a top surface of a second gate electrode that is laterally offset by the pitch p of the array of deep trenches along the direction perpendicular to the lengthwise direction of the semiconductor material portions (32, 35, 38). In one embodiment, the lengthwise direction of the line trenches in which two peripheral portions of gate electrodes 52 are physically exposed can be perpendicular to the lengthwise direction of the semiconductor material portions (32, 35, 38).

Additional line trenches can be formed over the drain contact via structures 88. The line trenches formed over the drain contact via structures 88 are laterally spaced from the line trenched within which top surfaces of the gate electrodes 52 are physically exposed.

The various line trenches are filled with at least one conductive material such as TiN, TaN, WN, Ti, Ta, W, Cu, Al, or combinations thereof. The at least one conductive material can be deposited, for example, by chemical vapor deposition or physical vapor deposition. The excess conductive material deposited over the top surface of the line-level dielectric layer 90 is removed by planarization, which can be performed, for example, by chemical mechanical planarization (CMP).

The remaining portions of the at least one conductive material are line-level structures that are embedded within the line-level dielectric layer 90. The line-level structures include passing gate lines 95 and drain lines 98. The passing gate lines 95 are formed over the plane of the topmost surfaces of the gate electrodes 52, which is coplanar with the interface between the contact-level dielectric layer 80 and the line-level dielectric layer 90.

Each passing gate line 95 can overlie a portion of a conductive strap structure 18'. Each of the passing gate line 95 can contact top surfaces of a pair of gate electrodes 52, i.e., a gate electrode 52 of a first access transistor and a gate electrode 52 of a second access transistor that is laterally offset from the first access transistor by the pitch p along the lengthwise direction of the passing gate line 95, which is perpendicular to the lengthwise direction of the semiconductor material portions (32, 35, 38). The bottom surface of each passing gate line 95 can be coplanar with the top surface of the contact-level dielectric layer 80 and with the bottom surface of the line-level dielectric layer 90. The length of each passing gate line 95 along the lengthwise direction of the passing gate line 95 can be less than the pitch p of the periodicity of the deep trenches along the lengthwise direction of the passing gate line 95, which can be perpendicular to the lengthwise direction of the semiconductor material portions (32, 35, 38).

Each trench capacitor and the access transistor that controls the flow of electrical charges into the trench capacitor collectively constitute a dynamic random access memory (DRAM) cell within an array of DRAM cells. The array of DRAM cells can have a periodicity along a lengthwise direction of the passing gate line 95, which is the same as the pitch of the passing gate lines 95 along the lengthwise direction of the passing gate line 95.

Each set of the gate electrodes 52 and the passing gate lines 95 that are electrically shorted to one another constitutes a gate line (52, 95). Each gate line (52, 95) can thus include a plurality of gate electrodes 52 and passing gate lines 95 that are electrically connected to one another and extend along the lengthwise direction of the gate lines 52 and the passing gate lines 95. Each gate line (52, 95) is a dual level structure that is present across two levels, i.e., the contact level in which the contact-level dielectric layer 80 embedding the gate electrodes 52 is present and the line level in which the line-level dielectric layer 90 embedding the passing gate lines 95.

Figure 14:
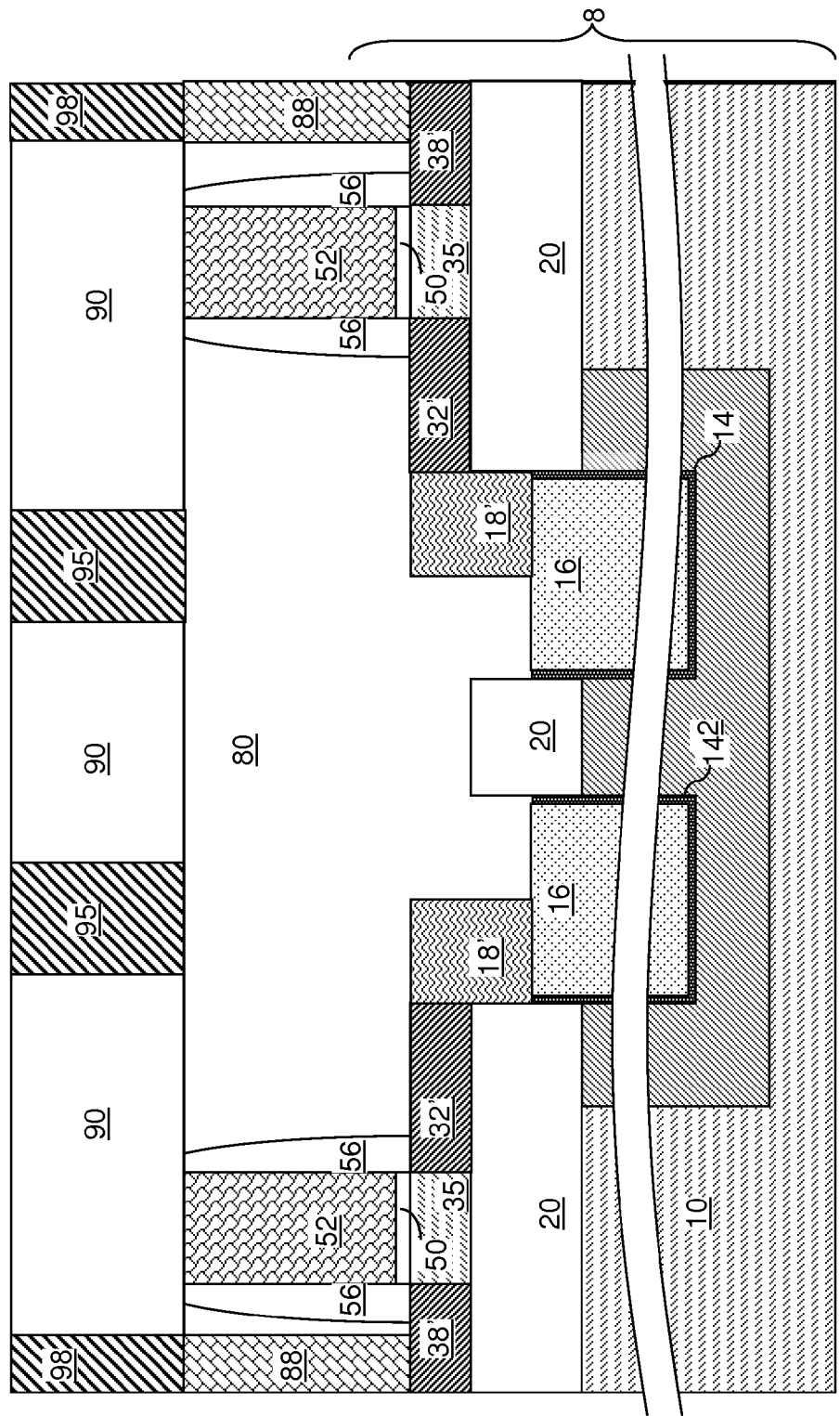
FIG. 14 is a vertical cross-sectional view of a variation of the exemplary semiconductor structure.

Referring to FIG. 14, a variation of the exemplary semiconductor structure can be derived from the exemplary structure by omitting the step of selective epitaxy that forms the raised source regions 62, the raised drain regions 68, and the outer conductive strap structures 61. In this embodiment, the anneal that outdiffuses dopants from the raised source regions 62 and the raised drain regions 68 into the semiconductor material portions 30 can be replaced with an ion implantation step that forms source regions 32' and the drain regions 38' by ion implantation of dopants. The dopants are selected such that the conductivity type of the dopants is the opposite of the conductivity type of the semiconductor material portions prior to the ion implantation step. P-n junctions are formed between each pair of a body region 35 and a source region 32' and between each pair of a body region 35 and a drain region 38'. Optionally, metal semiconductor alloy regions can be formed as known in the art. The drain contact via structures 88 can contact the drain regions 38' directly.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure, said method comprising:

forming trench capacitors in a substrate, wherein each of said trench capacitors comprises an inner electrode, a node dielectric, and an outer electrode;

forming laterally contacting pairs of a semiconductor material portion and a conductive strap structure, wherein each of said conductive strap structures contacts an inner electrode of one of said trench capacitors;

forming gate stacks, wherein each gate stack straddles over one of said semiconductor material portions and comprises a gate dielectric and a gate electrode;

forming a contact-level dielectric layer over said semiconductor material portions and said conductive strap structures and surrounding each gate stack, wherein to surfaces of said gate electrodes of each gate stack are exposed; and forming passing gate lines overlying a portion of said conductive strap structures and atop said contact-level dielectric layer, wherein each of said passing gate lines contacts said top surfaces of a pair of gate electrodes.

2. The method of claim 1, further comprising:
forming a conductive cap structure over each of said inner electrodes; and
patterning said top semiconductor layer and said conductive cap structures, wherein remaining portions of said top semiconductor layer constitute said semiconductor material portions, and remaining portions of said conductive cap structures constitute said conductive strap structures.

3. The method of claim 2, further comprising forming hardmask structures on said top semiconductor layer, wherein said patterning of said top semiconductor layer and said conductive cap structures is performed by transferring a pattern of said hardmask structures into said top semiconductor layer and said conductive cap structures.

4. The method of claim 2, wherein a top surface of a buried insulator layer in said substrate and portions of top surfaces of said inner electrodes are physically exposed after said patterning of said top semiconductor layer and said conductive cap structures.

5. The method of claim 1, further comprising:
forming a line-level dielectric layer over said contact-level dielectric layer; and
forming line-level structures within said line-level dielectric layer, wherein said line-level structures comprise said passing gate lines.

6. The method of claim 1, wherein said contact-level dielectric layer is deposited directly on a top surface of said buried insulator layer.

7. The method of claim 1, further comprising forming an outer conductive strap structure directly on top surfaces of said inner electrodes and sidewalls and top surfaces of said conductive strap structures.

8. The method of claim 7, further comprising forming a raised source region directly on each of said semiconductor material portions.

9. The method of claim 8, further comprising forming an inner source region by diffusing electrical dopants from said raised source regions into sub-portions of said semiconductor material portions that are in contact with said raised source regions.

* * * * *